US011871665B2

United States Patent
Hatasako et al.

(10) Patent No.: US 11,871,665 B2
(45) Date of Patent: Jan. 9, 2024

(54) THERMOELECTRIC GENERATION SYSTEM

(71) Applicant: YANMAR POWER TECHNOLOGY CO., LTD., Osaka (JP)

(72) Inventors: Yoshika Hatasako, Osaka (JP); Jiro Fukudome, Osaka (JP); Shuichi Nakagawa, Osaka (JP)

(73) Assignee: Yanmar Power Technology Co., Ltd., Osaka (JP)

( * ) Notice: Subject to any disclaimer, the term of this patent is extended or adjusted under 35 U.S.C. 154(b) by 76 days.

(21) Appl. No.: 17/051,315

(22) PCT Filed: May 10, 2019

(86) PCT No.: PCT/JP2019/018803
§ 371 (c)(1),
(2) Date: Oct. 28, 2020

(87) PCT Pub. No.: WO2019/216426
PCT Pub. Date: Nov. 14, 2019

(65) Prior Publication Data
US 2021/0050502 A1 Feb. 18, 2021

(30) Foreign Application Priority Data

May 11, 2018 (JP) .................................. 2018-092630
Nov. 12, 2018 (JP) .................................. 2018-211896

(51) Int. Cl.
*H10N 10/13* (2023.01)
(52) U.S. Cl.
CPC .................................... *H10N 10/13* (2023.02)
(58) Field of Classification Search
CPC .......... H01L 35/30; H01L 35/32; H10N 10/13
See application file for complete search history.

(56) References Cited

U.S. PATENT DOCUMENTS 8,618,406 B1 * 12/2013 Bilak ..................... H01L 35/30
136/200
2004/0221577 A1 * 11/2004 Yamaguchi ............... F02G 5/02
60/520
(Continued)

FOREIGN PATENT DOCUMENTS

| EP | 3468030 A1 | 4/2019 |
| JP | 2018-074659 A | 5/2018 |

(Continued)

OTHER PUBLICATIONS

International Search Report and Written Opinion for PCT Patent App. No. PCT/JP2016/077855 (dated Jul. 2, 2019) with English translation of the ISR.

*Primary Examiner* — Devina Pillay
(74) *Attorney, Agent, or Firm* — Cermak Nakajima & McGowan LLP; Tomoko Nakajima

(57) ABSTRACT

A thermoelectric generation system is provided with: a thermoelectric element; a heating unit; a cooling unit; a heat transfer unit; a pressure gauge; a first valve; and a control unit. The thermoelectric element uses a temperature difference to generate power. The heating unit has a first heat medium path through which a heat medium passes, and heats the thermoelectric element by means of the heat of the heat medium. The cooling unit cools the thermoelectric element. The heat transfer unit has a second heat medium path through which the heat medium passes and which is connected to the first heat medium path, and heats, by using a heat source, the heat medium reduced in temperature as a result of heating the thermoelectric element. The pressure gauge detects the rise or fall of a value (pressure of heat medium) in accordance with the temperature of the heat source.

18 Claims, 17 Drawing Sheets

(56) References Cited

U.S. PATENT DOCUMENTS

| | | | |
|---|---|---|---|
| 2010/0236595 A1* | 9/2010 | Bell | H01L 35/30 |
| | | | 136/205 |
| 2011/0209740 A1* | 9/2011 | Bell | H01L 35/30 |
| | | | 136/224 |
| 2019/0003342 A1 | 1/2019 | Yamamine | |
| 2019/0334073 A1* | 10/2019 | Hatasako | H01L 35/30 |
| 2020/0091395 A1 | 3/2020 | Hatasako et al. | |

FOREIGN PATENT DOCUMENTS

| | | | |
|---|---|---|---|
| WO | WO2017/145425 A1 | 8/2017 | |
| WO | WO2017/204283 A1 | 11/2017 | |
| WO | WO-2018079170 A1 * | 5/2018 | F01N 5/025 |

\* cited by examiner

CONVENTIONAL ART 1

Time

CONVENTIONAL ART 2

Time

THERMOELECTRIC GENERATION SYSTEM

This application is a national phase entry under 35 U.S.C. § 371 of PCT Patent Application No. PCT/JP2019/018803, filed on May 10, 2019, which claims priority under 35 U.S.C. § 119 to Japanese Patent Application No. 2018-092630, filed May 11, 2018 and to Japanese Patent Application No. 2018-211896, filed Nov. 12, 2018, all of which are incorporated by reference.

TECHNICAL FIELD

The present invention mainly relates to a thermoelectric generation system which uses a thermoelectric element to generate power.

BACKGROUND ART

Patent Literature 1 discloses a thermoelectric generation system. The thermoelectric generation system is provided with a thermoelectric element, a heating unit which heats the thermoelectric element, and a cooling unit which cools the thermoelectric element. The thermoelectric element generates power on the basis of a temperature difference which is achieved by the heating unit and the cooling unit.

CITATION LIST

Patent Literature

Patent Literature 1: WO 2017/204283

DISCLOSURE OF INVENTION

Problems to be Solved by the Invention

Since the amount of power generation by the thermoelectric generation system depends on the temperature of an external heat source or the like, adjustment of the amount of power generation may be difficult in some cases. However, Patent Literature 1 does not describe adjustment of the amount of power generation. Therefore, a thermoelectric generation system capable of adjusting the amount of power generation is desired.

The present invention has been conceived in view of the above circumstances, and the main object of the invention is to provide a thermoelectric generation system capable of adjusting the amount of power generation.

Means for Solving the Problems and Effect of the Invention

The problem to be solved by the present invention is as described above, and the means for solving the problem and the effect of such a solution will be described in the following.

According to an aspect of the present invention, a thermoelectric generation system having the following configuration is provided. More specifically, the thermoelectric generation system is provided with a thermoelectric element, a heating unit, a cooling unit, a heat transfer unit, a detection unit, an adjustment unit, and a control unit. The thermoelectric element generates power by a temperature difference. The heating unit includes a first heat medium path through which a heat medium passes, and heats the thermoelectric element by the heat of the heat medium. The cooling unit cools the thermoelectric element. The heat transfer unit includes a second heat medium path through which the heat medium passes and which is connected to the first heat medium path, and heats, by using a heat source, the heat medium whose temperature is decreased as a result of heating the thermoelectric element. The detection unit detects the temperature of the heat source or a value that fluctuates according to the temperature of the heat source. The adjustment unit changes the amount of the heat medium which circulates through the first heat medium path and the second heat medium path. The control unit controls the adjustment unit on the basis of the value detected by the detection unit to adjust the amount of the heat medium.

The amount of power generation by the thermoelectric element changes according to the temperature and the amount of the heat medium. The amount of power generation can be adjusted by adjusting the amount of the heat medium on the basis of the value detected by the detection unit.

Preferably, in the thermoelectric generation system described above, the following structure should be adopted. That is, when the value detected by the detection unit is a first value, the control unit controls the adjustment unit in such a way that the amount of the heat medium is equivalent to a first amount. When the value detected by the detection unit is a second value that is lower than the first value, the adjustment unit is controlled in such a way that the amount of the heat medium is equivalent to a second amount, which is greater in amount than the first amount.

By this structure, when the value (the temperature of the heat medium) detected by the detection unit decreases, the amount of the heat medium is increased. Thereby, a significant reduction in the amount of power generation is suppressed. Meanwhile, when the value (the temperature of the heat medium) detected by the detection unit increases, the amount of the heat medium is reduced. Thereby, a significant increase in the amount of power generation is suppressed. The amount of power generation can thereby be stabilized.

In the thermoelectric generation system described above, preferably, the control unit should acquire a thermal resistance of the thermoelectric element, and adjust the amount of the heat medium by controlling the adjustment unit on the basis of the thermal resistance.

The amount of power generation by the thermoelectric element changes according to the thermal resistance of the thermoelectric element. Accordingly, the amount of power generation can be adjusted by adjusting the amount of the heat medium on the basis of the thermal resistance.

In the thermoelectric generation system described above, preferably, the control unit should control the adjustment unit in such a way that the higher the acquired thermal resistance is, the less the amount of the heat medium becomes.

By this feature, when the thermal resistance turns into low resistance, the amount of the heat medium is increased. Thereby, a significant reduction in the amount of power generation is suppressed. Meanwhile, when the thermal resistance turns into high resistance, the amount of the heat medium is reduced. Thereby, a significant increase in the amount of power generation is suppressed. The amount of power generation can thereby be stabilized.

In the thermoelectric generation system described above, preferably, the control unit should control the adjustment unit in such a way that the amount of power generation by the thermoelectric element is equivalent to a rated power generation amount in terms of durability of the thermoelectric element.

Consequently, power can be generated at the rated power generation amount.

Preferably, in the thermoelectric generation system described above, the following structure should be adopted. That is, the heat transfer unit is provided inside a heat source duct, and the thermoelectric element is provided outside the heat source duct. Each of the heat transfer unit and the thermoelectric element is attached to a flange member which constitutes a part of a wall portion of the heat source duct, which is formed by closing an opening of the heat source duct.

By this structure, it is possible to install the thermoelectric generation system on the heat source duct with a simple structure.

In the thermoelectric generation system described above, preferably, a supporting member, which supports the thermoelectric element on an installation surface or a ceiling surface outside the heat source duct, should be provided.

By this feature, since the thermoelectric element is supported on the installation surface or the ceiling surface, a load exerted on the heat source duct can be reduced.

Preferably, in the thermoelectric generation system described above, the following structure should be adopted. That is, the thermoelectric generation system is provided with a pressure holding container, a discharge valve, a return valve, and an auxiliary heat transfer unit. The pressure holding container stores the heat medium, and holds the pressure of the heat medium that is being stored at a set value. The discharge valve is provided as the adjustment unit, and when the pressure of the heat medium in the first heat medium path satisfies a first pressure condition, the discharge valve moves the heat medium to the pressure holding container. The return valve is provided as the adjustment unit, and when the pressure of the heat medium in the first heat medium path satisfies a second pressure condition in which the pressure is lower than that of the first pressure condition, the return valve moves the heat medium in the pressure holding container to the first heat medium path. The auxiliary heat transfer unit uses the heat source to heat the heat medium stored in the pressure holding container, thereby approximating the pressure of the aforementioned heat medium to the set value.

By this feature, in accordance with the pressure of the heat medium in the first heat medium path, the heat medium can be moved between the first heat medium path and the pressure holding container. Consequently, since the amount of the heat medium which circulates through the first heat medium path and the second heat medium path can be maintained at an appropriate value, it is possible to prevent reduction in the amount of power generation. Also, since the auxiliary heat transfer unit is provided, it is possible to prevent the pressure of the heat medium in the pressure holding container from decreasing. In particular, since the heat medium in the pressure holding container is heated by using the heat source, the amount of electricity to be used can be reduced as compared to a configuration in which heating is performed with electric energy.

In the thermoelectric generation system described above, preferably, an auxiliary cooling unit, which cools the heat medium stored in the pressure holding container, thereby approximating the pressure of the heat medium stored in the pressure holding container to the set value, should be provided.

By this feature, when the pressure of the heat medium in the pressure holding container is high, the aforementioned pressure can be reduced.

In the thermoelectric generation system described above, preferably, an auxiliary heat transfer valve, which changes the amount of the heat medium for conducting heat exchange with the heat source in the auxiliary heat transfer unit so as to approximate the pressure of the heat medium stored in the pressure holding container to the set value, should be provided.

By this feature, the degree of heating of the heat medium by the auxiliary heat transfer unit can be changed. Accordingly, the auxiliary cooling unit can be omitted or the cooling level required for the auxiliary cooling unit can be lowered.

DESCRIPTION OF EMBODIMENTS

Figure 1:
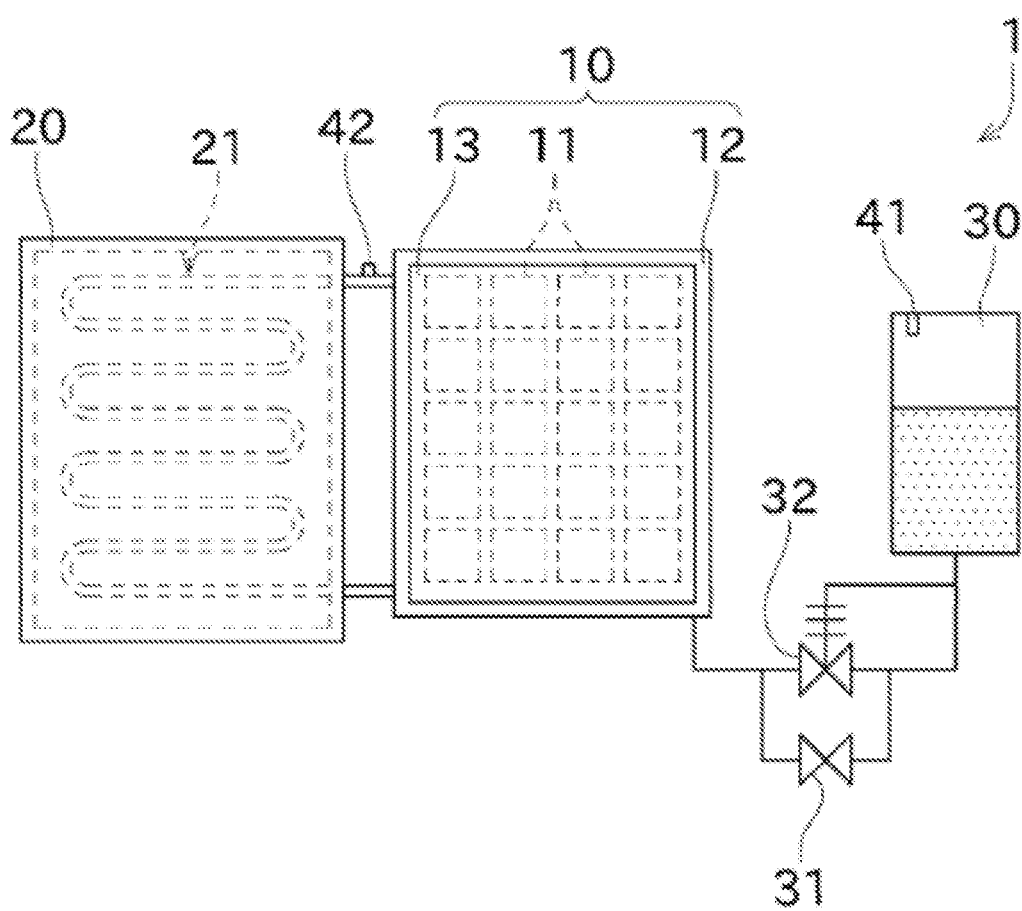
FIG. 1 is a schematic view showing an overall configuration of a thermoelectric generation system according to a first embodiment of the present invention.
Figure 2:
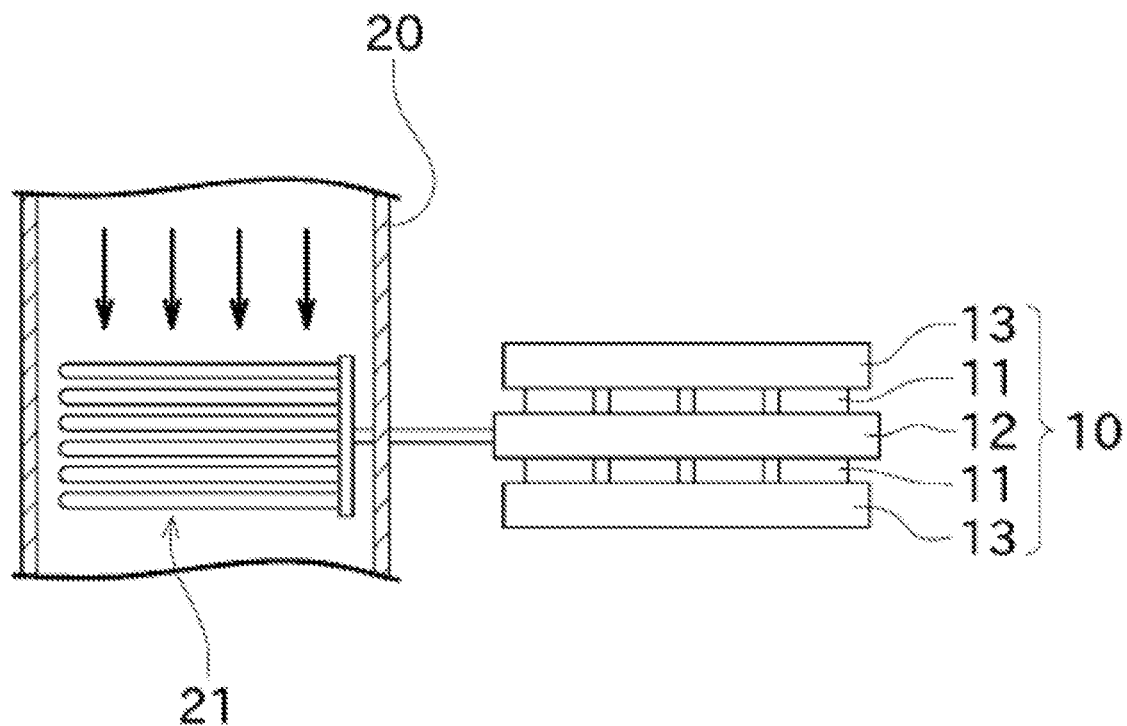
FIG. 2 is a plan view of the thermoelectric generation system.
Figure 3:
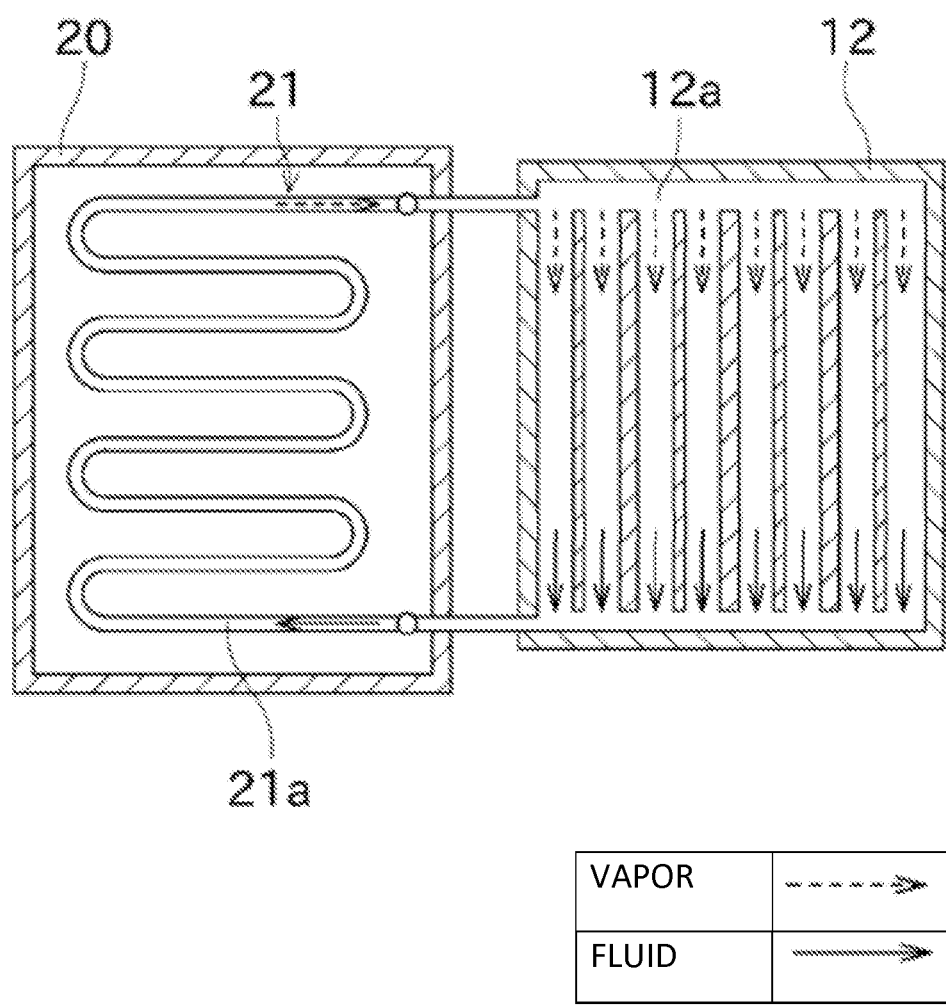
FIG. 3 is an illustration showing the way in which a heat medium flows through a first heat medium path and a second heat medium path.

Next, a first embodiment of the present invention will be described with reference to the accompanying drawings. First, referring to FIGS. 1 to 3, a configuration of a thermoelectric generation system 1 will be described. FIG. 1 is a schematic view showing an overall configuration of the thermoelectric generation system 1 according to the first embodiment. FIG. 2 is a plan view of the thermoelectric generation system 1. FIG. 3 is an illustration showing the way in which a heat medium flows through a first heat medium path 12a and a second heat medium path 21a.

The thermoelectric generation system 1 is arranged at a place having a heat source, such as exhaust gas from an engine or factory exhaust heat, and uses the heat obtained from the above heat source to generate power. As shown in FIGS. 1 and 2, the thermoelectric generation system 1 is provided with a power generation module 10. The power generation module 10 is provided with a thermoelectric element 11, a heating unit 12, and a cooling unit 13.

As shown in FIG. 2, the thermoelectric elements 11 are respectively arranged on both side surfaces of the heating unit 12 in a thickness direction thereof. The thermoelectric element 11 and the heating unit 12 are arranged so as to be in contact with each other. In addition, each of the cooling units 13 is arranged on a surface of the thermoelectric element 11 on the other side (i.e., the surface different from the one being in contact with the heating unit 12). As described above, in the power generation module 10 of the present embodiment, a pair of thermoelectric elements 11 is arranged so as to sandwich the heating unit 12 in the thickness direction, and a pair of cooling units 13 is arranged so as to further sandwich the thermoelectric elements 11 in the thickness direction. Consequently, while one side surface of the thermoelectric element 11 is heated by the heating unit 12, the other side surface of the thermoelectric element 11 is cooled by the cooling unit 13.

The thermoelectric element 11 is a plate-like element, and generates an electromotive force on the basis of a difference in temperature between the one side surface, which is in contact with the heating unit 12, and the other side surface, which is in contact with the cooling unit 13. In the power generation module 10 of the present embodiment, as shown in FIG. 1, a plurality of thermoelectric elements 11 are arranged longitudinally and laterally side by side in a direction perpendicular to the thickness direction of the thermoelectric element 11. Note that the number of thermoelectric elements 11 of the present embodiment and how they are arranged are merely given as an example, and the thermoelectric elements 11 whose number is different from the number in the present embodiment may be arranged, or the thermoelectric elements 11 may be arranged in a way different from the present embodiment.

The heating unit 12 is arranged so as to contact the one side surface of each of the plurality of thermoelectric elements 11. The heating unit 12 heats the one side surface of the thermoelectric element 11 by using a heat medium whose temperature is raised as a result of heat exchange with the heat source. In the present embodiment, the heat medium is water, but a substance different from water may be employed. Hereinafter, a specific path through which the heat medium flows will be described.

As shown in FIG. 3, the first heat medium path 12a is formed inside the heating unit 12. The first heat medium path 12a includes a path formed along a vertical direction so that the heat medium can move along the vertical direction. It suffices that the vertical direction is included as a component in the first heat medium path 12a, and the first heat medium path 12a may be, for example, a path which moves the heat medium obliquely downward. The heat medium heated by the heat source is turned into gas (high-temperature vapor), and is supplied to the heating unit 12. The vapor flows vertically downward along the first heat medium path 12a. The heat medium, which is high-temperature vapor, is condensed due to a temperature drop caused by heat exchange with the thermoelectric element 11 via the surface of the heating unit 12, and is changed from gas to fluid.

The heat medium which has turned into fluid is heated by the heat source. Specifically, the thermoelectric generation system 1 is provided with a heat source duct 20. In the heat source duct 20, a space through which the exhaust gas and factory exhaust heat, etc., pass is formed. Also, the heat source duct 20 is provided with a heat transfer unit 21. The heat transfer unit 21 is a tubular member which is arranged inside the heat source duct 20, and is connected to the power generation module 10. Note that the shape of the heat transfer unit 21 is not limited to tubular as long as heat exchange with the heat source is possible.

Inside the heat transfer unit 21, the second heat medium path 21a, constituted by heat-transfer tubes, is formed. The heat-transfer tubes are configured to include a plurality of linear paths extending linearly in a horizontal direction, and a curved path of a curved shape connecting these linear paths. In other words, in the second heat medium path 21a, the vertical direction is included as a component, and the second heat medium path 21a includes a portion which moves the heat medium upward in the vertical direction. Further, as shown in FIG. 2, a plurality of (six in the present embodiment) heat-transfer tubes are arranged in a longitudinal direction of the heat source duct 20. By virtue of this configuration, it is possible to sufficiently heat the heat medium by using the heat of the heat source. Alternatively, the number of heat-transfer tubes to be arranged may be one. The fluid heat medium, which has been supplied to the second heat medium path 21a of the heat-transfer tube, is changed from fluid to gas by being heated. This allows the heat medium to move vertically upward in the curved path. After that, the gaseous heat medium is supplied to the first heat medium path 12a.

In this way, the heat medium circulates through the first heat medium path 12a and the second heat medium path 21a without requiring the power of a pump or the like. By this feature, the one side surface of the thermoelectric element 11 is heated by means of the heat of the heat source. Note that the thermoelectric generation system 1 may be configured to move the heat medium through a path different from the path of the present embodiment, or may be configured to discharge the heat medium by a pump or the like.

The cooling unit 13 is arranged so as to contact the other side surface of each of the plurality of thermoelectric elements 11. Inside the cooling unit 13, a path through which a cooling medium flows is formed. To the cooling unit 13, a cooling medium supply path and a cooling medium discharge path, which are not shown, are connected. The cooling medium supply path is a path through which the cooling medium, which has been cooled by a cooling facility that is not illustrated, is supplied to the cooling unit 13. By the above feature, the other side surface of the thermoelectric element 11 is cooled by the cooling medium. The cooling medium whose temperature is raised as a result of cooling the thermoelectric element 11 is discharged from the cooling medium discharge path, and is supplied to the cooling facility. In the present embodiment, the cooling medium is water, but a substance different from water may be employed. Moreover, the heat medium and the cooling medium may be the same substance, or may be substances different from each other.

As described above, an electromotive force is generated in the thermoelectric element 11 by a difference in temperature between the one side surface and the other side surface of the thermoelectric element 11. The power generated by the thermoelectric element 11 is supplied to a predetermined electrical device via an electrical wire and an inverter, etc., not shown.

Next, referring mainly to FIG. 1, a mechanism for adjusting a supply of the heat medium which circulates through the first heat medium path 12*a* and the second heat medium path 21*a*, and the amount of the heat medium will be described. As shown in FIG. 1, the heat medium is stored in a heat medium tank 30. Also, a first valve (adjustment unit) 31 and a second valve (adjustment unit) 32 are respectively arranged in paths connecting between the heat medium tank 30 and the first heat medium path 12*a*.

The first valve 31 is used to supply the heat medium, which is stored in the heat medium tank 30, to the first heat medium path 12*a*. As the degree of opening of the first valve 31 is increased, the amount of the heat medium to be supplied from the heat medium tank 30 to the first heat medium path 12*a* is increased. In contrast, reducing the degree of opening of the first valve 31 reduces the amount of the heat medium to be supplied from the heat medium tank 30 to the first heat medium path 12*a*. Moreover, by closing the first valve 31, the heat medium is prevented from being supplied from the heat medium tank 30 to the first heat medium path 12*a*.

The second valve 32 is used to return the heat medium, which circulates through the first heat medium path 12*a* and the second heat medium path 21*a*, to the heat medium tank 30. The second valve 32 is a pressure valve (relief valve), and is opened when the pressure of the first heat medium path 12*a* exceeds a predetermined value. By this feature, an excessive heat medium can be returned to the heat medium tank 30.

Note that when the heat medium is to be supplied to the first heat medium path 12*a* and the second heat medium path 21*a* for the first time, the heat medium is supplied after the inside of the path has been sucked by a vacuum pump, which is not shown, connected to the above path. Also, in the case of supplying the heat medium again after the heat medium has been discharged from the first heat medium path 12*a* and the second heat medium path 21*a*, suction by the vacuum pump is similarly performed.

Figure 4:
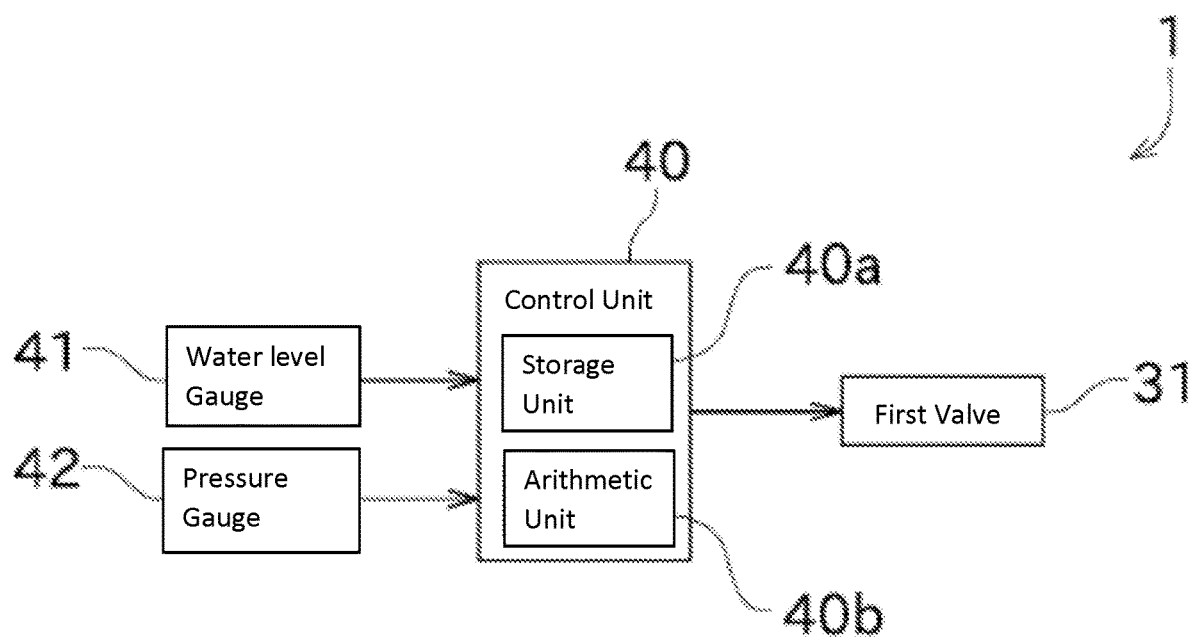
FIG. 4 is a block diagram of devices for use in the processing of adjusting the amount of the heat medium.

Next, with reference to FIG. 4, devices for use in the processing of adjusting the amount of the heat medium will be described. FIG. 4 is a block diagram of the devices used in the processing of adjusting the amount of the heat medium.

As shown in FIG. 4, the thermoelectric generation system 1 is provided with a control unit 40, a water-level gauge 41, and a pressure gauge (detection unit) 42, as the devices used in the processing of adjusting the amount of the heat medium.

The control unit 40 is configured by a known computer, and includes a storage unit 40*a* and an arithmetic unit 40*b*. The storage unit 40*a* is a hard disk, a flash memory, an optical disk, or the like, and stores a program and data, etc., that are necessary for controlling the thermoelectric generation system 1. The arithmetic unit 40*b* is an arithmetic processing device such as an FPGA, an ASIC, or a CPU. The arithmetic unit 40*b* is configured to enable execution of various kinds of processing related to the thermoelectric generation system 1 by reading and executing the program stored in the storage unit 40*a*, etc. Also, the control unit 40 is configured to enable control of changing the degree of opening of the first valve 31 described above.

The water-level gauge 41 measures the water level of the heat medium stored in the heat medium tank 30. The water-level gauge 41 is of, for example, an ultrasonic type which detects the water level by the time taken from when an ultrasonic wave is transmitted to when a reflected wave is received, a float type which detects the water level by the height of a float floating on the heat medium, or a capacitive type which uses the change in a capacitance corresponding to the amount of the heat medium. A result of detection by the water-level gauge 41 is output to the control unit 40. Note that a configuration enabling the water level of the heat medium tank 30 to be measured by a method different from the above methods may be employed.

The result of detection by the water-level gauge 41 is used to detect the amount of the heat medium which circulates through the first heat medium path 12*a* and the second heat medium path 21*a*. In other words, by subtracting the amount of the heat medium stored in the heat medium tank 30 from the amount of the heat medium initially introduced into the heat medium tank 30, the amount of the heat medium which circulates through the first heat medium path 12*a* and the second heat medium path 21*a* is calculated.

Alternatively, the amount of the heat medium which circulates through the first heat medium path 12*a* and the second heat medium path 21*a* may be calculated by using a device other than the water-level gauge 41. For example, the amount of the heat medium that is circulating can be estimated by subtracting a measurement result of the amount of the heat medium, which flows into the heat medium tank 30 from the first heat medium path 12*a*, from a measurement result (i.e., the measurement result of a flow sensor) of the amount of the heat medium which flows into the first heat medium path 12*a* from the heat medium tank 30. Alternatively, a flow sensor which detects the quantity of flow of fluid or gas may be installed at the first heat medium path 12*a* or the second heat medium path 21*a*, and the amount of the heat medium that is circulating can be estimated on the basis of a total quantity of the flow measured in a predetermined time.

The pressure gauge 42 is arranged in a path between the second heat medium path 21*a* and the first heat medium path 12*a*, which is the path directed toward the first heat medium path 12*a* from the second heat medium path 21*a*. The pressure gauge 42 measures the pressure of the heat medium (gas). A result of detection by the pressure gauge 42 is output to the control unit 40.

The pressure of the heat medium detected by the pressure gauge 42 changes according to the temperature of the heat source, for example. Specifically, as the temperature of the heat source becomes high, the pressure of the heat medium detected by the pressure gauge 42 also becomes high. Also, as the temperature of the heat source decreases, the pressure of the heat medium detected by the pressure gauge 42 also decreases.

In the present embodiment, the pressure gauge 42 is arranged at a portion downstream of the second heat medium path 21*a*, and upstream of the first heat medium path 12*a*. Alternatively, the pressure gauge 42 may be arranged in the second heat medium path 21*a* or the first heat medium path 12*a*. However, depending on the position, the heat medium may be fluid, or the change in the pressure corresponding to the heat medium may be small. For this reason, it is preferable that the pressure gauge 42 should be arranged at a relatively downstream portion of the second heat medium path 21a in a flow direction, or at a relatively upstream portion of the first heat medium path 12a in the flow direction.

As long as the configuration indicates fluctuation according to the temperature of the heat source, values other than the pressure of the heat medium may be detected. For example, the temperature of the heat source may be measured directly with a temperature sensor. Alternatively, a temperature sensor may be provided at the same position as that of the pressure gauge 42 to measure the temperature of the heat medium.

Figure 5:
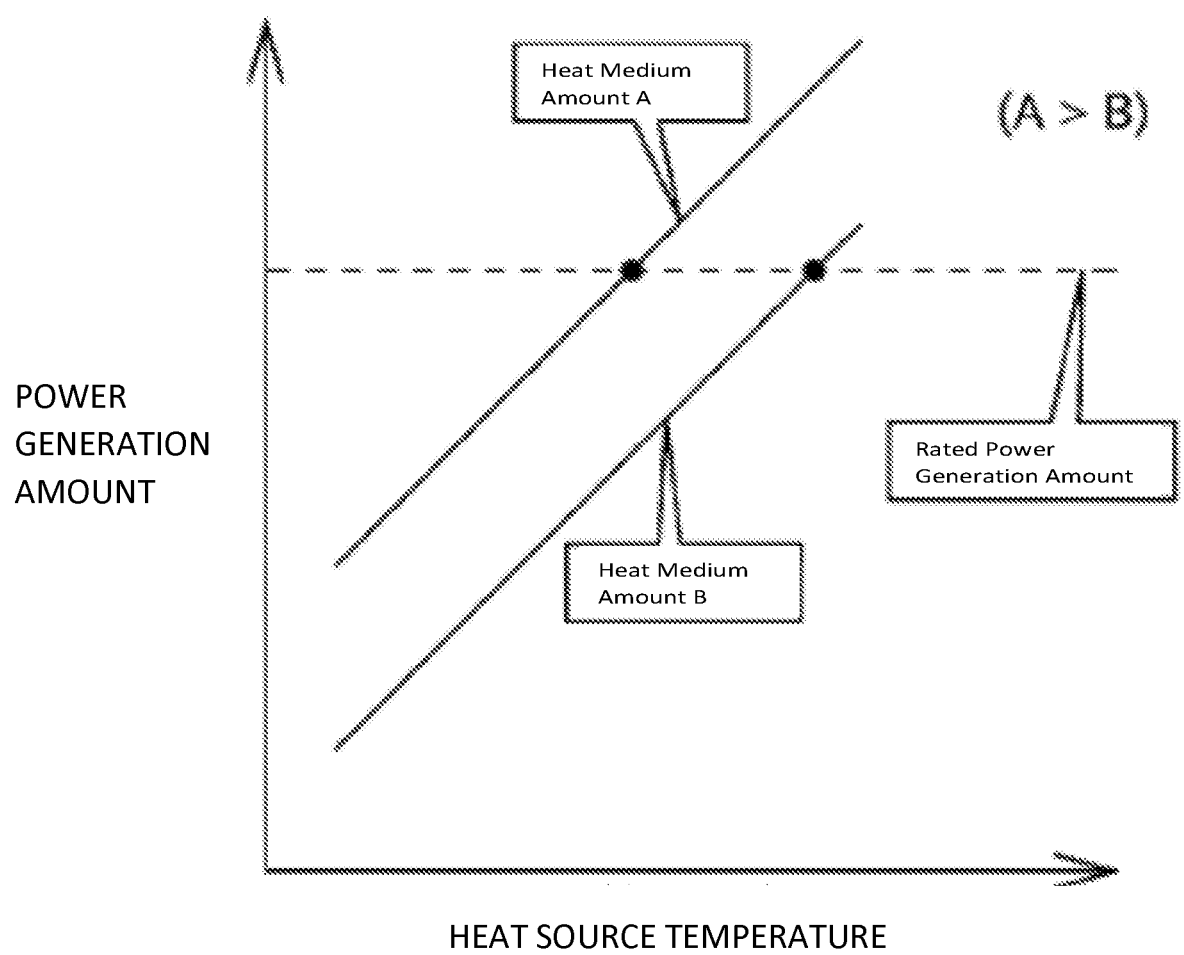
FIG. 5 is a graph showing the relationship between a heat source temperature and a power generation amount when the amount of the heat medium is varied.
Figure 6:
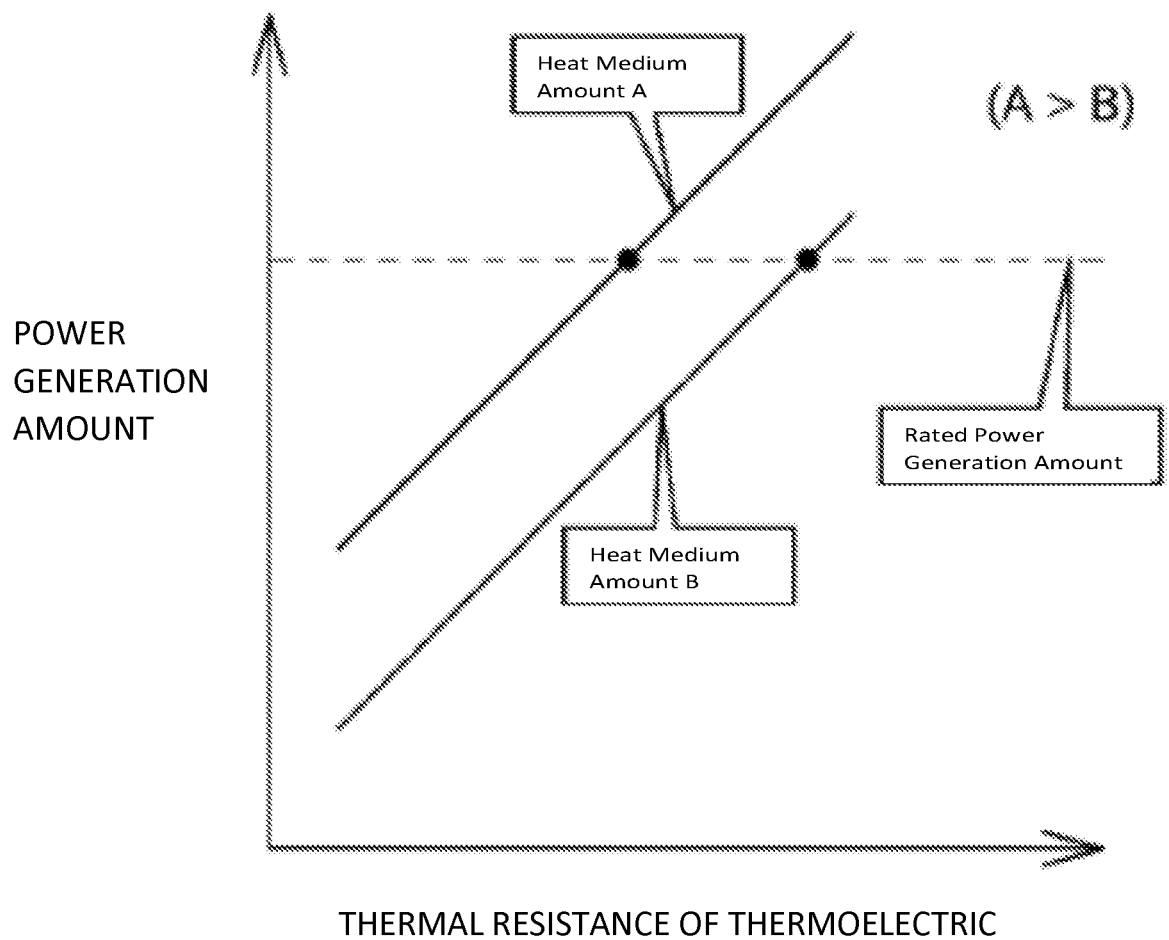
FIG. 6 is a graph showing the relationship between a thermal resistance and a power generation amount when the amount of the heat medium is varied.
Figure 7:
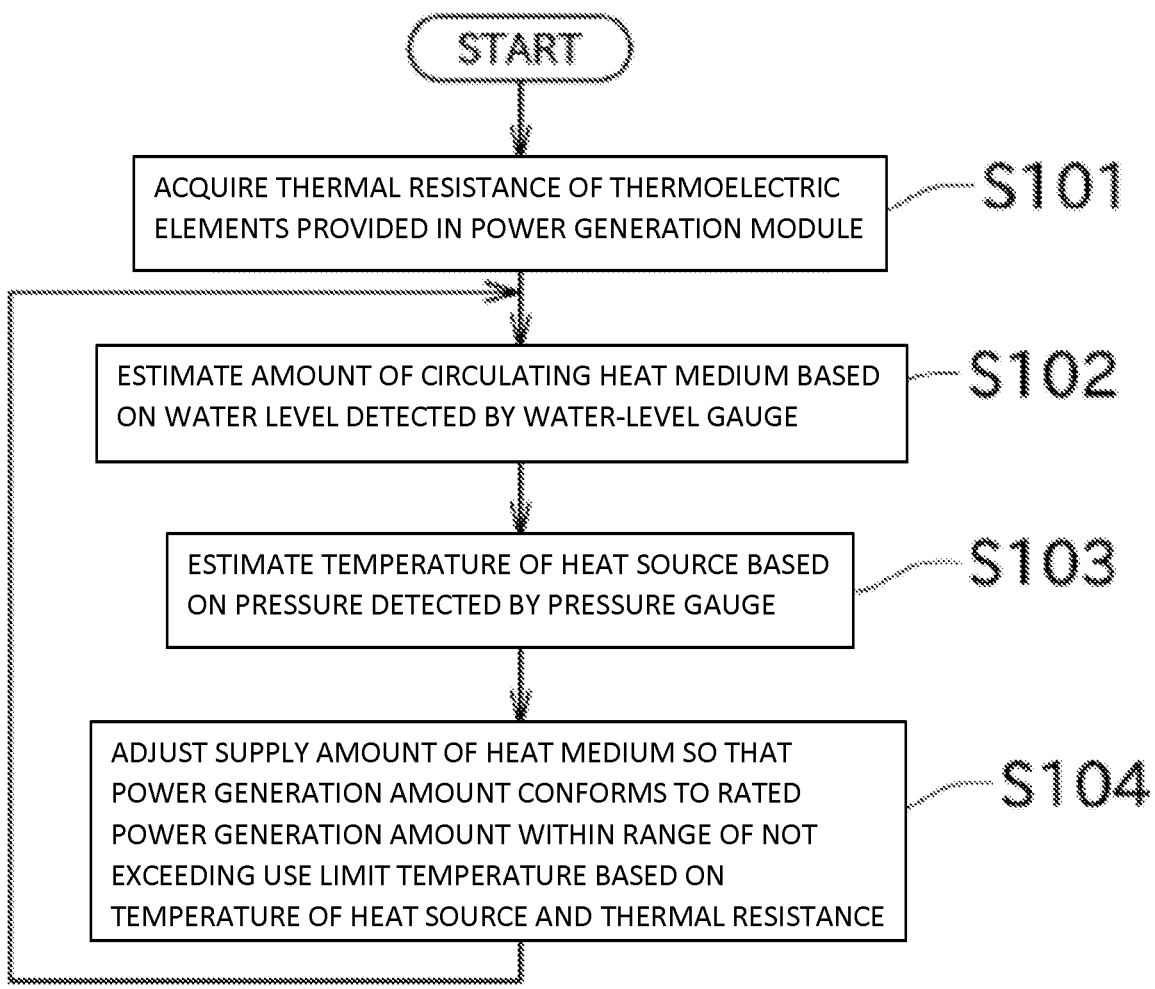
FIG. 7 is a flowchart showing heat medium amount adjustment control to be performed by a control unit.

Next, with reference to FIGS. 5 to 7, control to improve the power generation efficiency by varying the amount of the heat medium (hereinafter referred to as heat medium amount adjustment control) will be described. FIG. 5 is a graph showing the relationship between a heat source temperature and a power generation amount when the amount of the heat medium is varied. FIG. 6 is a graph showing the relationship between a thermal resistance and a power generation amount when the amount of the heat medium is varied. FIG. 7 is a flowchart showing the heat medium amount adjustment control to be performed by the control unit 40.

First, the relationship between the amount of the heat medium and the amount of power generation will be described. Basically, the more the amount of the heat medium is, the more the heat is transferred from the heat source to the thermoelectric element 11. Thus, the amount of power generation is increased. However, if there is plenty of heat medium, the pressure inside the first heat medium path 12a and the second heat medium path 21a may become high, or the temperature of the thermoelectric element 11 may exceed a use limit temperature. Therefore, too much heat medium is not preferable. Note that the use limit temperature is a temperature that is defined for the thermoelectric element 11 in advance, and if the temperature of the thermoelectric element 11 (specifically, the temperature of a portion of the thermoelectric element 11 being in contact with the heating unit 12) exceeds the use limit temperature, the thermoelectric element 11 may break.

In addition, as shown in FIG. 5, the higher the temperature of the heat source is, the more the heat is transferred from the heat source to the thermoelectric element 11, and thus, the amount of power generation is increased. Furthermore, as shown in FIG. 6, the higher the thermal resistance of the thermoelectric element 11 is, the more easily a temperature difference occurs, and thus, the amount of power generation is increased. Note that when the power generation module 10 includes a plurality of thermoelectric elements 11, the amount of power generation changes according to the thermal resistances of the plurality of thermoelectric elements 11 (that is, the thermal resistance of the power generation module). In the following description, the thermal resistance of one or more thermoelectric elements 11 is simply referred to as the "thermal resistance of the thermoelectric element 11".

In addition, a rated power generation amount is defined for a general power generation module 10. The rated power generation amount is the power generation capacity of the power generation module 10, that is, the maximum power generation amount that the power generation module 10 is set to be outputtable. Also, for the power generation module 10, the rated power generation amount is set as a specification in association with a temperature difference, a temperature on a high temperature side, a temperature on a low temperature side, and the like.

As can be seen, the amount of power generation depends on the amount of the heat medium, the temperature of the heat source, and the thermal resistance of the thermoelectric element 11. In addition, although the amount of power generation also depends on a situation, it is preferable that the amount of power generation should be made to conform to the rated power generation amount. In consideration of the above, the present embodiment adjusts the amount of the heat medium so that the amount of power generation conforms to the rated power generation amount within such a range that the temperature of the thermoelectric element 11 does not exceed the use limit temperature, in accordance with the temperature of the heat source and the thermal resistance of the thermoelectric element 11. The specific descriptions are given below.

The control unit 40 acquires a thermal resistance of the thermoelectric elements 11, as a whole, provided in the power generation module 10 (S101). The thermal resistance is a value different for each type of the thermoelectric element 11, and a manufacturer of the thermoelectric generation system 1, for example, inputs the value in advance to have the value stored in the storage unit 40a. Further, the arithmetic unit 40b acquires the thermal resistance from the storage unit 40a. Alternatively, a configuration in which a user of the thermoelectric generation system 1 inputs the thermal resistance of the thermoelectric element 11 so that the value is stored in the storage unit 40a may be employed. Furthermore, it is possible to store a table in which information for identifying the thermoelectric element 11 (a model number, an identification number, etc.) and the thermal resistance of the thermoelectric element 11 are associated with each other in the storage unit 40a in advance, and the storage unit 40a may identify the thermoelectric element 11 currently in use, and acquire the thermal resistance corresponding to the identified thermoelectric element 11 from the table.

Next, the control unit 40 estimates the amount of the heat medium circulating through the first heat medium path 12a and the second heat medium path 21a, on the basis of the water level detected by the water-level gauge 41 (S102). Then, the control unit 40 estimates the temperature of the heat source on the basis of the pressure detected by the pressure gauge 42 (S103).

Next, the control unit 40 adjusts the amount of supply of the heat medium so that the amount of power generation conforms to (approximates) the rated power generation amount within such a range that the temperature of the thermoelectric element 11 does not exceed the use limit temperature, on the basis of the temperature of the heat source and the thermal resistance (S104).

Specifically, in a situation where the amount of power generation is equivalent to the rated power generation amount, when the temperature of the heat source decreases, the amount of supply of the heat medium is increased. Thereby, the amount of the heat medium to circulate is increased. Consequently, reduction in the amount of power generation can be prevented. Also, when the temperature of the heat source increases in a situation where the amount of power generation is equivalent to the rated power generation amount, the amount of supply of the heat medium is reduced (by the heat medium returning to the heat medium tank 30 via the second valve 32). Thereby, the amount of the heat medium to circulate is reduced. Consequently, the pressure of the heat medium becoming too high can be prevented. Moreover, when the temperature of the thermoelectric element 11 is close to the use limit temperature, the amount of supply of the heat medium is maintained or reduced, thereby maintaining or reducing the temperature of the thermoelectric element 11. Since the temperature of the thermoelectric element 11 has a correlation with the temperature of the heating unit 12, the temperature of the thermoelectric element 11 can be estimated from a result of detection by the pressure gauge 42. Alternatively, a temperature sensor may be attached to the thermoelectric element 11 to directly detect the temperature of the thermoelectric element 11.

Also, although the thermal resistance does not change during operation of the thermoelectric generation system 1, when the thermoelectric element 11 having a small thermal resistance is used, for example, as compared to a case where the thermoelectric element 11 having a large thermal resistance is used, the amount of the heat medium that is circulating is increased as a result of increase in the amount of the heat medium to circulate. Thus, reduction in the amount of power generation can be prevented. Conversely, when the thermoelectric element 11 having a large thermal resistance is used, as compared to a case where the thermoelectric element 11 having a small thermal resistance is used, the amount of supply of the heat medium is reduced so that the amount of the heat medium to circulate is reduced (as a result of the heat medium returning to the heat medium tank 30 via the second valve 32). Thus, it is possible to prevent the pressure of the heat medium from becoming too high and prevent the temperature of the thermoelectric element 11 from exceeding the use limit temperature.

In the present embodiment, the amount of the heat medium to be circulated is determined on the basis of both the temperature of the heat source and the thermal resistance. Therefore, the amount of the heat medium to be circulated is determined in consideration of both the effect of the temperature of the heat source and the effect of the thermal resistance.

In addition, while there are various methods for determining the amount of the heat medium to be circulated, one option is to, for example, perform feedback control with the rated power generation amount being assumed as a target value and the current amount of power generation being used as the current value. In other words, the amount of the heat medium is increased until the current amount of power generation conforms to the rated power generation amount. Alternatively, the amount of the heat medium to be increased or decreased may be determined by performing an operation based on the current heat source temperature, the thermal resistance, and the amount of the heat medium that is circulating (in other words, by feed-forward control).

Also, since the temperature of the heat source may change, the steps of processing from steps S102 to S104 are performed as needed. By doing so, even if the temperature of the heat source is changed, it is possible to prevent the pressure of the heat medium from becoming too high, and prevent the temperature of the thermoelectric element 11 from exceeding the use limit temperature, while maintaining the amount of power generation.

Figure 8:
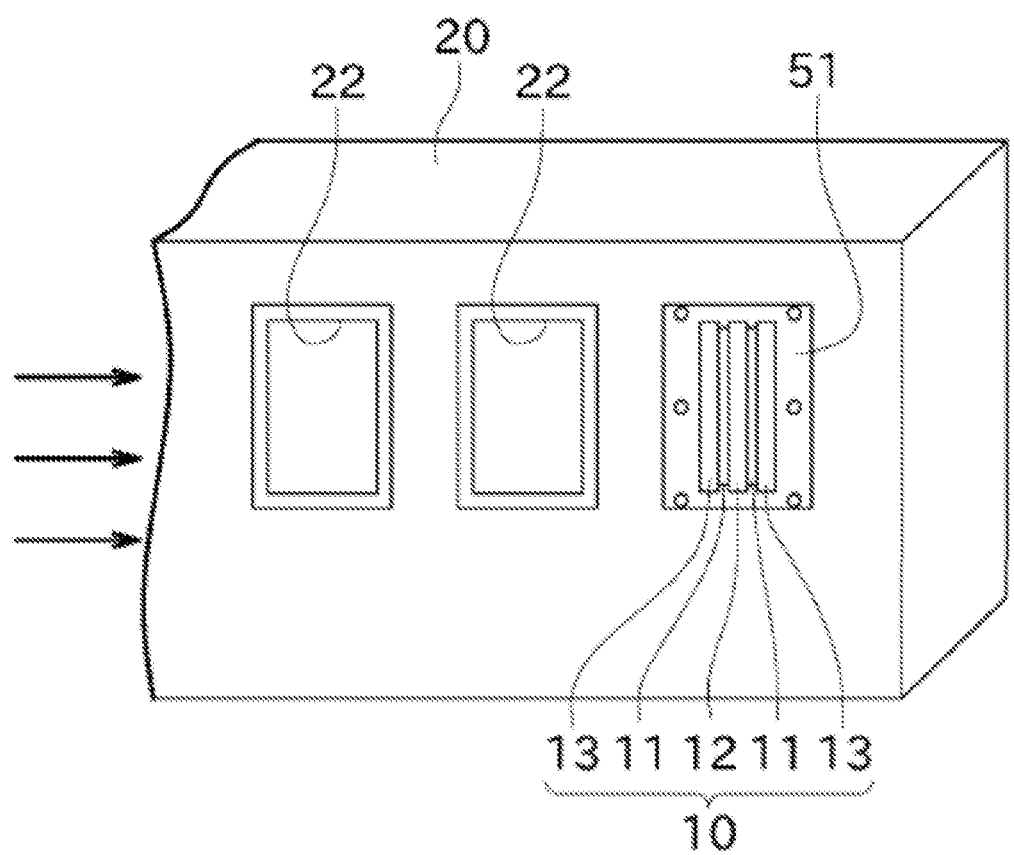
FIG. 8 is an illustration showing the state in which the thermoelectric generation system including a flange member is installed on a heat source duct.
Figure 9:
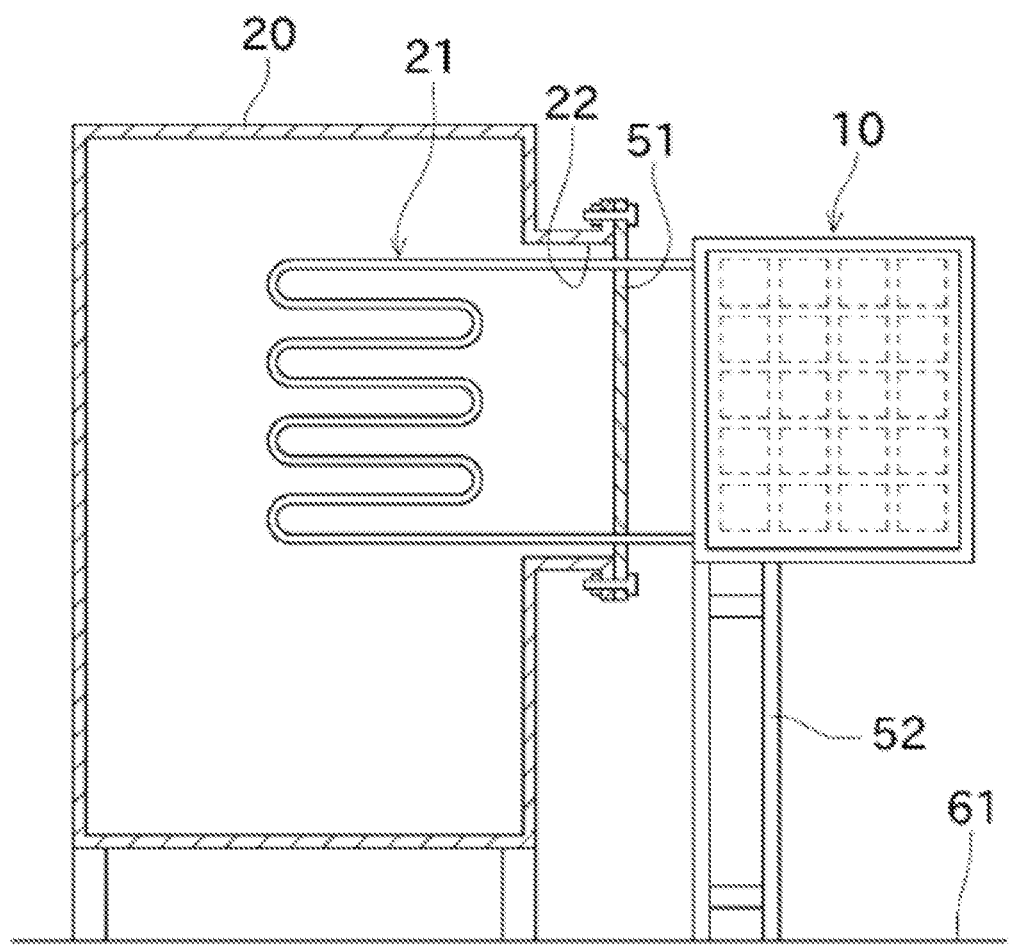
FIG. 9 is an illustration showing the state in which the thermoelectric generation system is supported on an installation surface.
Figure 10:
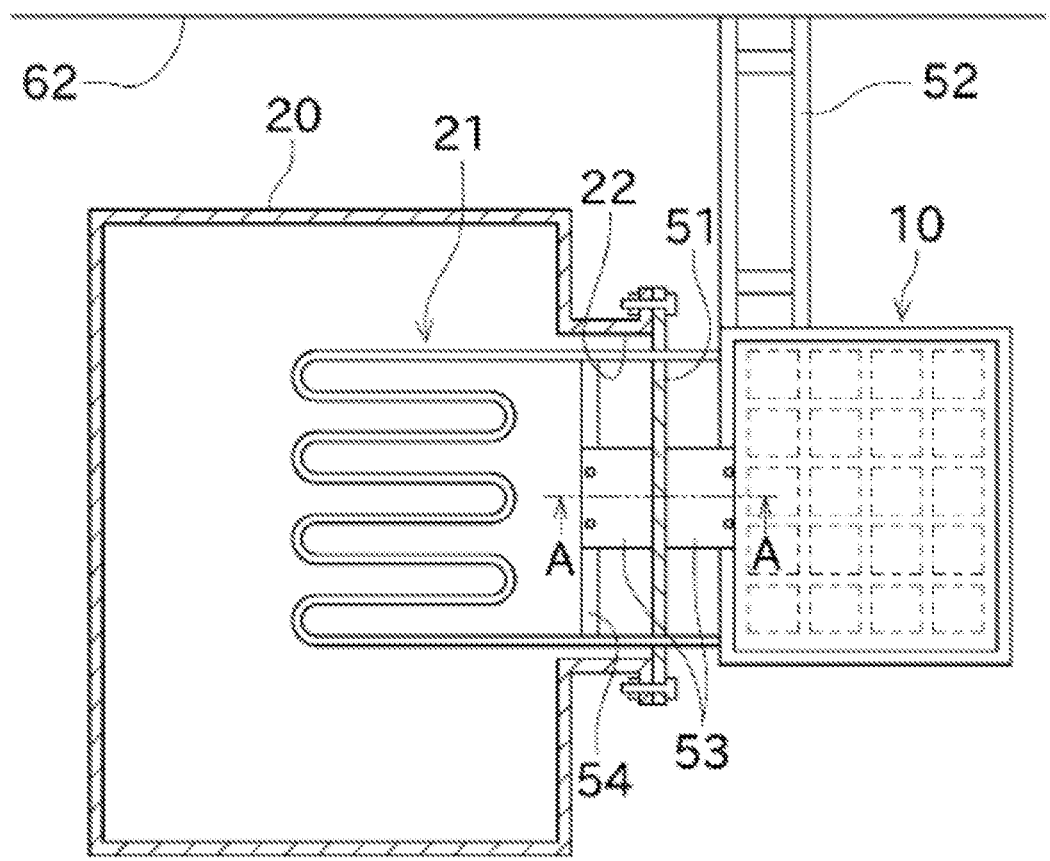
FIG. 10 is an illustration showing the state in which the thermoelectric generation system is supported on a ceiling surface.
Figure 11:
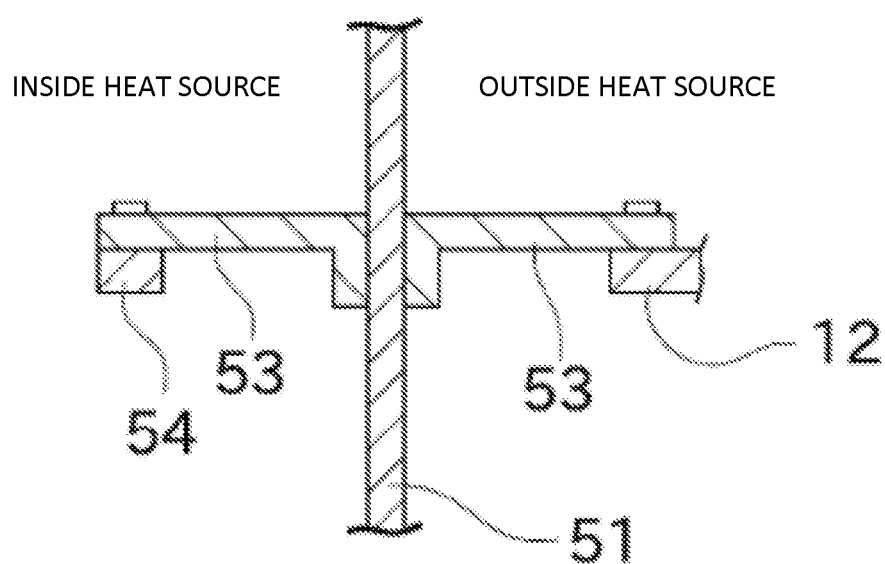
FIG. 11 is a cross-sectional view showing the shape of a fixing bracket, taken along line A-A of FIG. 10.
Figure 11:
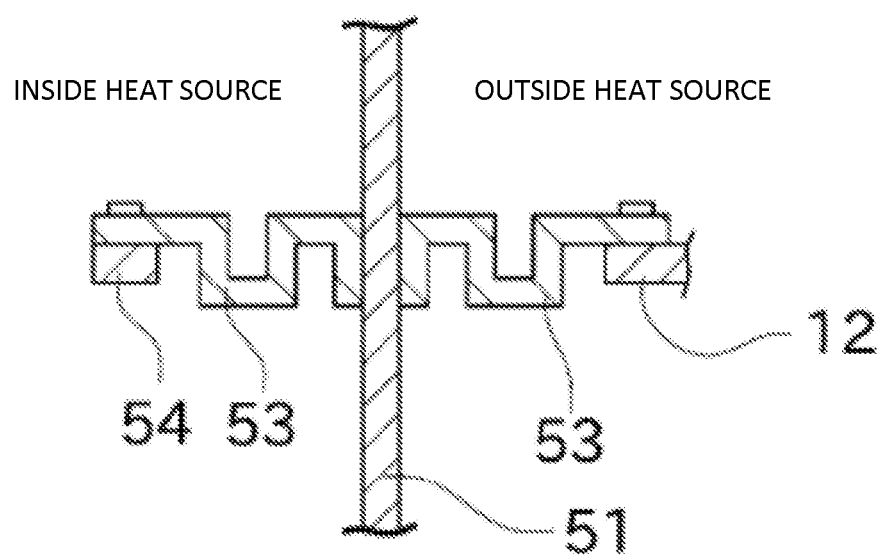

Next, a configuration for installing the thermoelectric generation system 1 on the heat source duct 20 will be described with reference to FIGS. 8 to 11. FIG. 8 is an illustration showing the state in which the thermoelectric generation system 1 including a flange member 51 is installed on the heat source duct 20. FIG. 9 is an illustration showing the state in which the thermoelectric generation system 1 is supported on an installation surface 61. FIG. 10 is an illustration showing the state in which the thermoelectric generation system 1 is supported on a ceiling surface 62. FIG. 11 is a cross-sectional view showing the shape of a fixing bracket 53, taken along line A-A of FIG. 10.

As shown in FIG. 8, a plurality of openings 22 are formed in a wall portion of the heat source duct 20. The thermoelectric generation system 1 (particularly, elements such as the power generation module 10 and the heat transfer unit 21, similarly, the same applies to the following) is mounted to each of the openings 22. Also, the thermoelectric generation system 1 is provided with the flange member 51 for facilitating the mounting to the opening 22.

The flange member 51 is a plate-shaped member, and constitutes a part of the wall portion of the heat source duct 20, which is formed by closing the opening 22 as shown in FIG. 8. Specifically, the opening 22 is formed at a portion where the heat source duct 20 is extended outward, as shown in FIG. 9. By this configuration, since a fixing tool is prevented from entering inside the heat source duct 20, the flange member 51 can be attached to the heat source duct 20 with the fixing tool. Note that the flange member 51 may be attached to the heat source duct 20 by welding.

In the present embodiment, the heat transfer unit 21 is provided inside the heat source duct 20, and the power generation module 10 is provided outside the heat source duct 20. Therefore, the flange member 51 is arranged between the heat transfer unit 21 and the power generation module 10. Thus, in the flange member 51, a through hole for passing the heat transfer unit 21 is formed. Also, the flange member 51 is attached to the heat transfer unit 21 by welding. Consequently, the heat transfer unit 21, the power generation module 10, and the flange member 51 can be integrally handled. Note that a method of attachment is not limited to the welding. For example, a pipe joint may be attached to the flange member 51, and the heat transfer unit 21 on the side of the heat source duct 20 and the heat transfer unit 21 on the side of the power generation module 10 may be connected via the pipe joint.

As described above, by merely mounting the thermoelectric generation system 1 including the flange member 51 to the heat source duct 20, installation of the thermoelectric generation system 1 is possible.

Also, in the present embodiment, in order to reduce a load exerted on the heat source duct 20 by the thermoelectric generation system 1, a supporting member 52 which supports the power generation module 10 (that is, supports the thermoelectric element 11) is provided. In FIG. 9, the supporting member 52 is a member for supporting the weight of the thermoelectric generation system 1 on the installation surface 61. The installation surface 61 is a surface on which the thermoelectric generation system 1 is installed (supported), and may be the same surface as the installation surface of the heat source duct 20, or a different surface from the installation surface of the heat source duct 20.

In addition, generally, the center of gravity of the thermoelectric generation system 1 is on the side of the power generation module 10 (that is, outside the heat source duct 20). Accordingly, by arranging the supporting member 52 at a position close to the center of gravity of the thermoelectric generation system 1, the thermoelectric generation system 1 can be made to support itself. Thus, the load exerted on the heat source duct 20 can be eliminated or substantially reduced. The position close to the center of gravity in the above means that the center of gravity of the thermoelectric generation system 1 is at a position between a front end and a rear end of the supporting member 52 in FIG. 9, where the front end refers to a portion of the supporting member 52 closest to the heat source duct 20, and the rear end refers to an end portion on the opposite side.

Also, the supporting member 52 may be configured to be slidable relative to the installation surface 61 by a wheel provided, for example, at the lower part of the supporting member 52. By such a configuration, the thermoelectric generation system 1 can be slid to be installed on the heat source duct 20, or the thermoelectric generation system 1 can be slid to be detached from the heat source duct 20 at the time of maintenance. As a result, it is possible to save time and effort of a worker.

FIG. 10 shows a configuration for supporting the thermoelectric generation system 1 on the ceiling surface 62 instead of the installation surface 61. Also in this case, the thermoelectric generation system 1 can be stably supported by mounting the supporting member 52 at a position close to the center of gravity.

Further, FIG. 10 shows the configuration in which the flange member 51 is attached to the heat transfer unit 21 and the power generation module 10 (that is, the thermoelectric element 11) by using the fixing bracket 53. The fixing bracket 53 may be used in combination with the above-described welding of the heat transfer unit 21 and the flange member 51. Furthermore, the fixing bracket 53 can be used also in a case where the thermoelectric generation system 1 is supported not on the ceiling surface 62 but on the installation surface 61.

An auxiliary member 54 is attached to the heat transfer unit 21 in the proximity of the flange member 51. The auxiliary member 54 is arranged so as to connect an upstream-side end portion and a downstream-side end portion of the heat transfer unit 21. The fixing bracket 53 is attached so as to connect the auxiliary member 54 and the flange member 51.

Also, the thermoelectric generation system 1 is provided with another fixing bracket 53 for attachment for the flange member 51 and the power generation module 10. This fixing bracket 53 is attached so as to connect the flange member 51 and the power generation module 10. In the present embodiment, although the fixing bracket 53 and the heating unit 12 are connected, an element other than the heating unit 12 may be connected to the fixing bracket 53. By providing the fixing brackets 53, the heat transfer unit 21 and the power generation module 10 can be stably attached to the flange member 51 and supported.

The fixing brackets 53 are made of metal, and since the fixing bracket 53 in particular, arranged inside the heat source duct 20, becomes a high temperature, thermal expansion and therefore thermal strain can occur. If the effect of the thermal strain is negligible, a linear fixing bracket 53, as shown on the upper side of FIG. 11, may be used. If the effect of the thermal strain is not negligible, preferably, a fixing bracket 53 having a shape less likely to produce thermal strain by virtue of a change in the shape even if thermal expansion occurs, as shown on the lower side of FIG. 11, should be used. The lower side of FIG. 11 shows the fixing bracket 53 having a shape that includes a bent or curved part, and exhibits flexibility at the time of thermal expansion.

Figure 12:
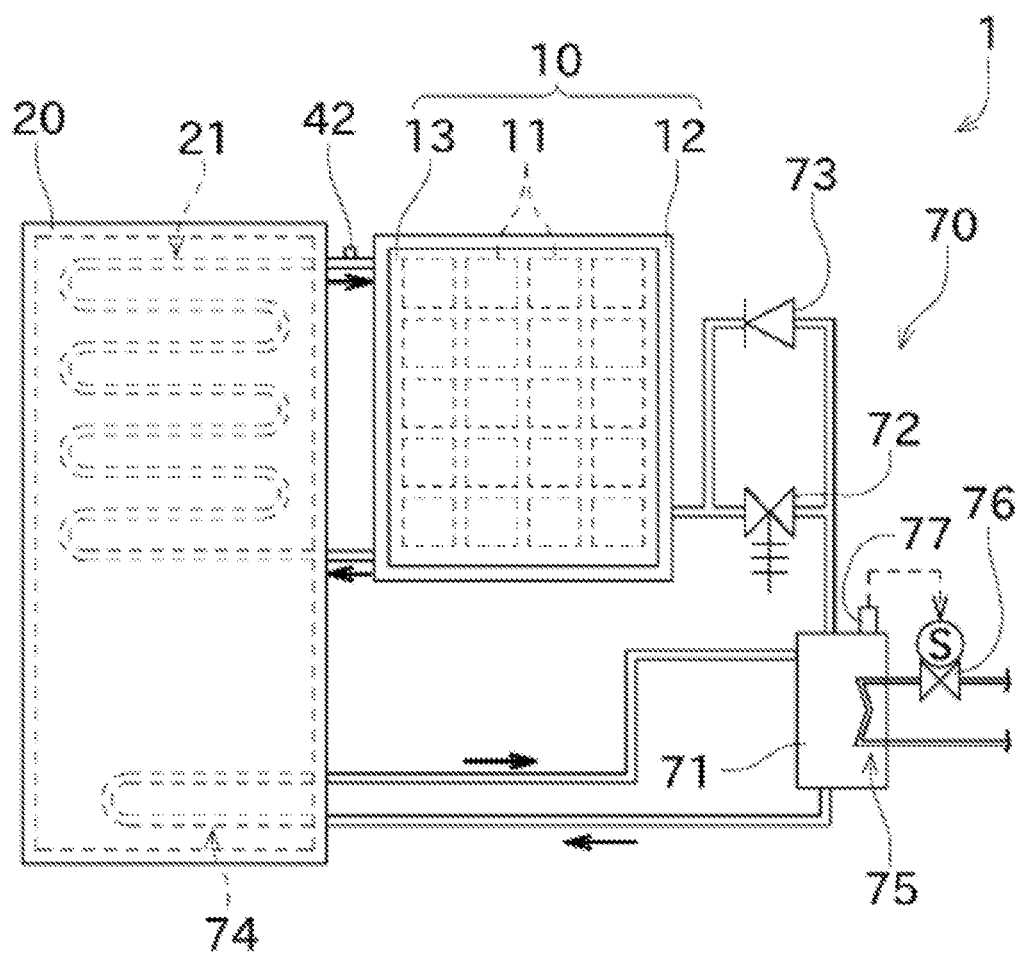
FIG. 12 is a schematic view showing an overall configuration of a thermoelectric generation system according to a second embodiment.
Figure 13:
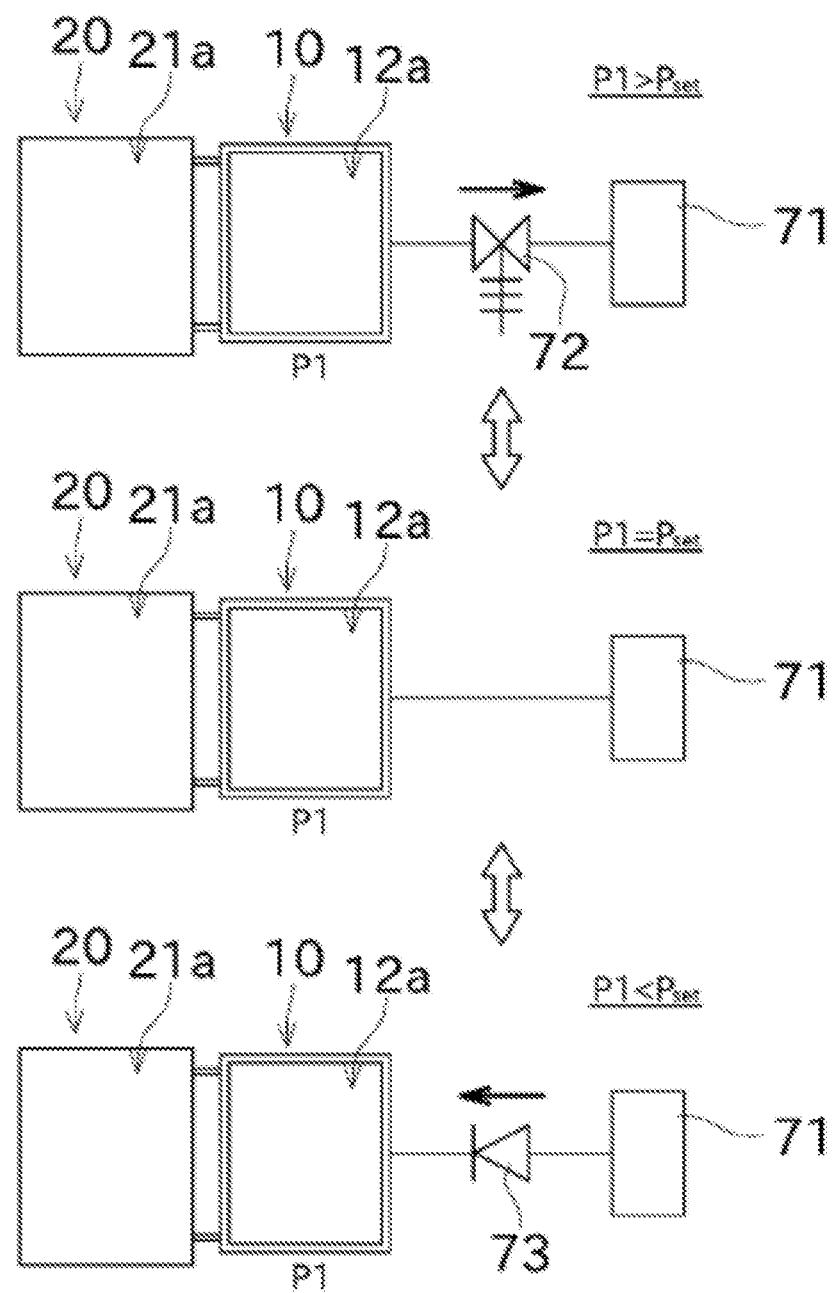
FIG. 13 is an illustration showing that a heat medium moves between a first heat medium path and a pressure holding container, in accordance with the pressure of the first heat medium path.
Figure 14:
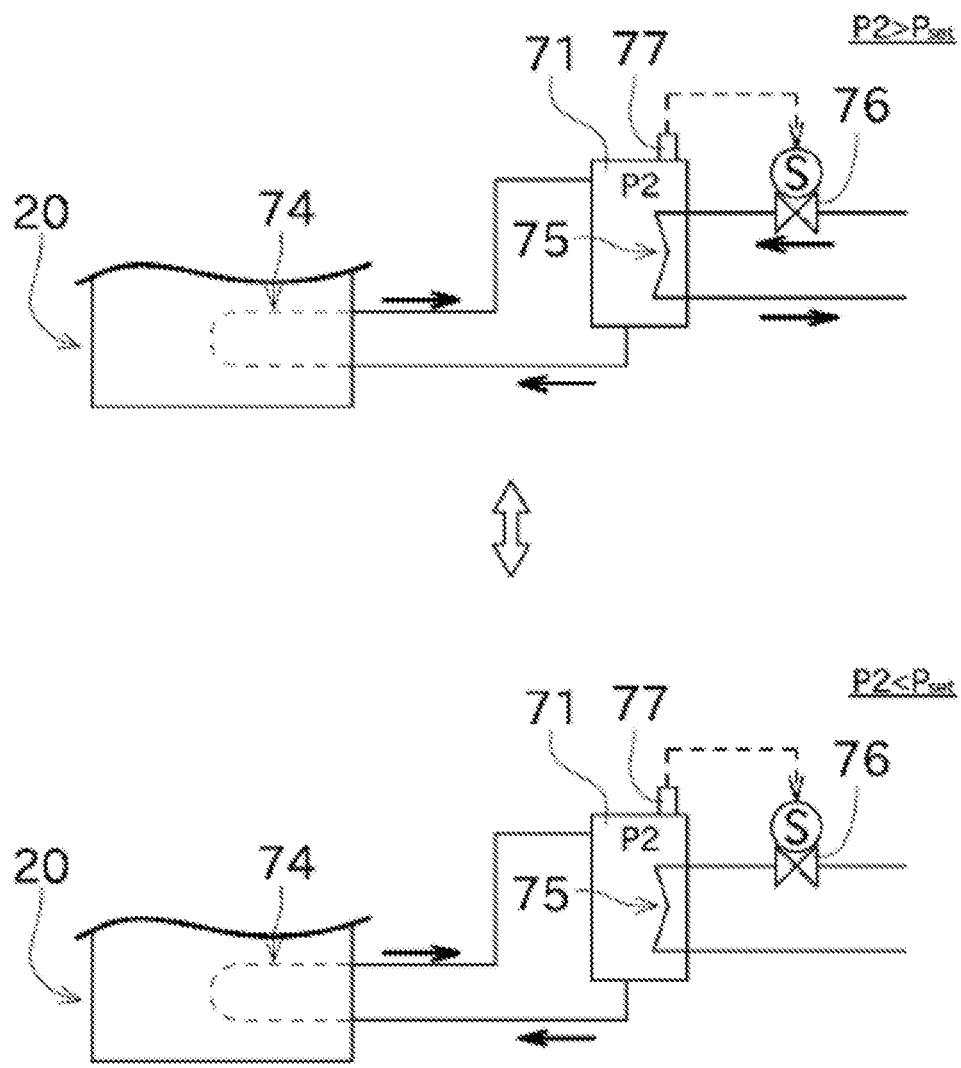
FIG. 14 is an illustration showing the processing of approximating the pressure of the heat medium stored in the pressure holding container to a set value.

Next, a second embodiment will be described with reference to FIGS. 12 to 14. FIG. 12 is a schematic view showing an overall configuration of a thermoelectric generation system 1 according to the second embodiment. FIG. 13 is an illustration showing that a heat medium moves between a first heat medium path 12a and a pressure holding container 71, in accordance with the pressure of the first heat medium path 12a. FIG. 14 is an illustration showing the processing of approximating the pressure of the heat medium stored in the pressure holding container 71 to a set value. Note that the mounting structure described with reference to FIGS. 8 to 11 can be applied not only to the first embodiment but also to the second and third embodiments.

The thermoelectric generation system 1 of the second embodiment is different from that of the first embodiment in the configuration for changing the amount of the heat medium. As shown in FIG. 12, the thermoelectric generation system 1 is provided with a pressure holding unit 70 for holding the pressure of the heat medium which circulates through the first heat medium path 12a and a second heat medium path 21a, etc., at a constant value (the set value).

The pressure holding unit 70 is provided with the pressure holding container 71, a relief valve (adjustment unit, discharge valve) 72, a check valve (adjustment unit, return valve) 73, an auxiliary heat transfer unit 74, an auxiliary cooling unit 75, an auxiliary cooling valve 76, and a pressure switch 77.

The pressure holding container 71 stores the heat medium. Also, as the temperature of the heat medium stored in the pressure holding container 71 is adjusted by the auxiliary heat transfer unit 74 and the auxiliary cooling unit 75, the pressure is controlled to approximate the set value.

The relief valve 72 is connected to the first heat medium path 12a (for example, a portion which has been subjected to heat exchange by a heating unit 12) via a predetermined pipe. Likewise, the second valve 32, the relief valve 72 is used to move the heat medium which circulates through the first heat medium path 12a and the second heat medium path 21a to the pressure holding container 71. As shown by the illustration at the top of FIG. 13, as the relief valve 72 is opened when the pressure (P1 in FIG. 13) of the first heat medium path 12a is greater than the set value (Pset), an excessive heat medium is moved to the pressure holding container 71. Note that the heat medium does not pass through the relief valve 72 in the opposite direction.

Likewise, the relief valve 72, the check valve 73 is connected to the first heat medium path 12a (for example, a portion which has been subjected to heat exchange by the heating unit 12) via a predetermined pipe. Likewise, the first valve 31, the check valve 73 is used to move the heat medium stored in the pressure holding container 71 to the first heat medium path 12a. As shown by the illustration at the bottom of FIG. 13, as the check valve 73 is opened when the pressure of the first heat medium path 12a is less than the set value (Pset), the heat medium of the pressure holding container 71 is moved to the first heat medium path 12a. Note that the heat medium does not pass through the check valve 73 in the opposite direction.

Accordingly, in the present embodiment, the pressure of the heat medium in the first heat medium path 12a being greater than the set value corresponds to a "first pressure condition", and the pressure of the heat medium in the first heat medium path 12a being less than the set value corresponds to a "second pressure condition". A pressure range included in the second pressure condition is lower than a pressure range included in the first pressure condition. In the present embodiment, although a threshold value (the set value) of the first pressure condition and a threshold value (the set value) of the second pressure condition are the same, they may be slightly different from each other.

The auxiliary heat transfer unit 74 heats the heat medium stored in the pressure holding container 71 by using the heat of a heat source. Specifically, the auxiliary heat transfer unit 74 includes a first pipe connected to the lower part of the pressure holding container 71, a second pipe arranged inside a heat source duct 20, and a third pipe connected to the upper part of the pressure holding container 71. The heat medium stored in the pressure holding container 71 is supplied to the second pipe via the first pipe, whereby the heat medium is heated by the heat of the heat source. At least a part of the heat medium which has been heated is vaporized and returns to the pressure holding container 71 via the third pipe. By providing the auxiliary heat transfer unit 74, the pressure of the heat medium in the pressure holding container 71 can be raised.

The auxiliary cooling unit 75 includes a cooling pipe through which a cooling medium (for example, water) that is externally supplied passes. A part of the cooling pipe is arranged inside the pressure holding container 71. By the above arrangement, as heat exchange is conducted between the cooling medium of the cooling pipe and the heat medium stored in the pressure holding container 71, the heat medium is cooled.

The auxiliary cooling valve 76 is arranged on the cooling pipe of the auxiliary cooling unit 75. The auxiliary cooling valve 76 is configured to be capable of switching between an "open state" in which the cooling medium is supplied to the pressure holding container 71 and a "closed state" in which the cooling medium is not supplied to the pressure holding container 71. In the present embodiment, the auxiliary cooling valve 76 is in the "closed state" unless an instruction is given from the outside, and is switched to the "open state" by the instruction from the outside.

The pressure switch 77 determines whether the pressure of the heat medium in the pressure holding container 71 (P2 in FIG. 14) exceeds the set value (Pset mentioned above). The pressure switch 77 sends an instruction to the auxiliary cooling valve 76 when the pressure of the pressure holding container is greater than the set value. Thus, as shown by the illustration at the top of FIG. 14, the cooling medium is supplied to the pressure holding container 71, whereby the heat medium in the pressure holding container 71 is cooled. As a result, the pressure of the heat medium in the pressure holding container 71 is decreased. Meanwhile, the pressure switch 77 does not send the instruction (stops sending of the instruction) to the auxiliary cooling valve 76 when the pressure of the pressure holding container 71 is less than the set value. Thus, as shown by the illustration at the bottom of FIG. 14, the cooling medium is not supplied to the pressure holding container 71. Also, the heat medium in the pressure holding container 71 is constantly heated by the auxiliary heat transfer unit 74. Consequently, the pressure of the heat medium is raised as a result of the heat medium being heated and not being cooled.

In the present embodiment, a first threshold value (the set value) for starting cooling by the auxiliary cooling unit 75 and a second threshold value (the set value) for stopping the cooling by the auxiliary cooling unit 75 are the same. However, the first threshold value and the second threshold value may be varied. Further, the structure is not limited to the one which directly detects the pressure of the pressure holding container 71. That is, a different value, which fluctuates according to the aforementioned pressure, may be detected to switch between on and off of the cooling by the auxiliary cooling unit 75.

As described above, in the present embodiment, whether or not to supply the cooling medium is switched on the basis of the pressure of the pressure holding container 71. By doing so, the pressure of the heat medium in the pressure holding container 71 is held at a value close to the set value. In the present specification, even if the pressure of the heat medium in the pressure holding container 71 does not exactly agree with the set value constantly, if the pressure is controlled to approximate the set value, it is assumed that the pressure is "held at the set value".

In this way, the pressure of the pressure holding container 71 is held at the set value. Therefore, also in a case where the pressure of the first heat medium path 12a is decreased to be less than the set value, the heat medium is supplied from the pressure holding container 71 to the first heat medium path 12a via the check valve 73 until the pressure of the first heat medium path 12a reaches a value close to the set value. Further, as described above, in a case where the pressure of the first heat medium path 12a becomes greater than the set value, the heat medium is supplied to the pressure holding container 71 via the relief valve 72 until the pressure reaches the set value.

Figure 15A:
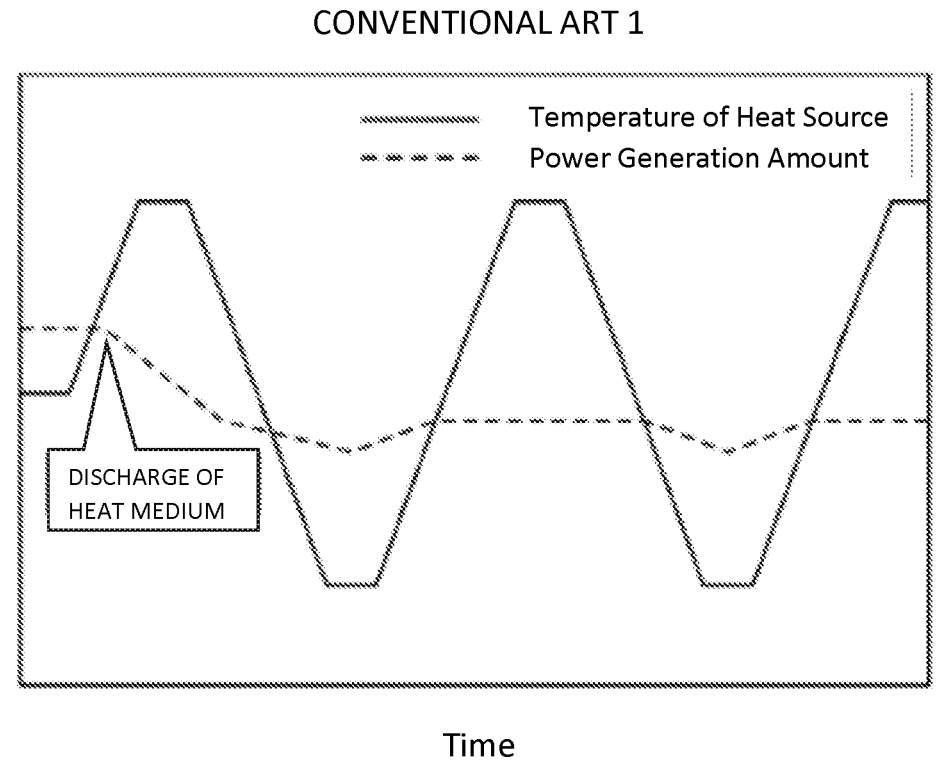
FIG. 15A and FIG. 15B are diagrams showing changes in the amount of power generation in conventional art 1 and 2 not having a structure of returning the heat medium.
Figure 15B:
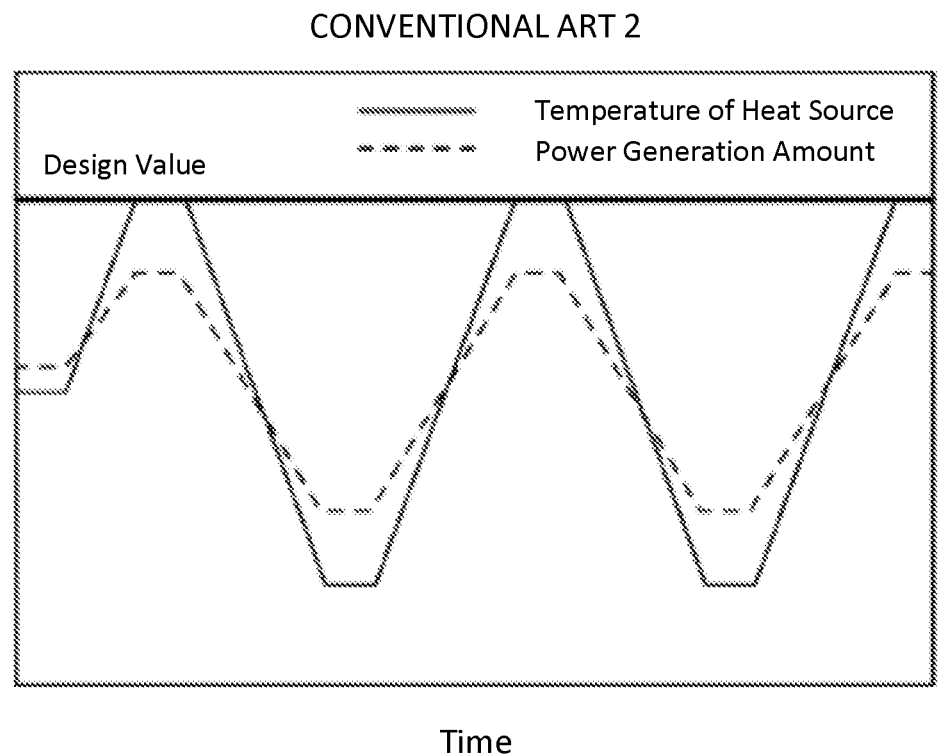

By the above, because the pressure holding unit 70 is provided, it is possible to suppress fluctuations of the pressure of the heat medium which circulates through the first heat medium path 12a and the second heat medium path 21a. It should be noted that a thermoelectric generation system of the conventional art merely includes a relief valve, and a structure including a check valve is not disclosed. Therefore, in a conventional thermoelectric generation system, as shown by a graph of conventional art 1 in FIG. 15A, when the temperature of a heat source increases, the pressure of a heat medium is raised, so the heat medium is discharged via the relief valve. In the conventional art, a structure of automatically returning the heat medium is not provided. Therefore, even if the temperature of the heat source decreases, the amount of the heat medium which circulates in a power generation module, etc., is left at a reduced level. For this reason, power generation of a sufficient amount may not be obtained in a state where the temperature of the heat source is low. Also, in conventional art 2 shown in FIG. 15B, the amount of a heat medium, etc., is determined with the maximum temperature of a heat source being set as a design value. In other words, conventional art 2 has been designed such that the maximum power generation amount according to the specifications of a power generation module can be realized in a state where the heat source is at the maximum temperature. Thereby, as shown by a graph of conventional art 2 in FIG. 15B, it is possible to prevent the heat medium from being discharged even if the temperature of the heat source increases. However, with the method of conventional art 2 as described above, the amount of power generation in a state where the temperature of the heat source is low is significantly reduced. Thus, a time average value of the amount of power generation becomes resultingly low.

Figure 16:
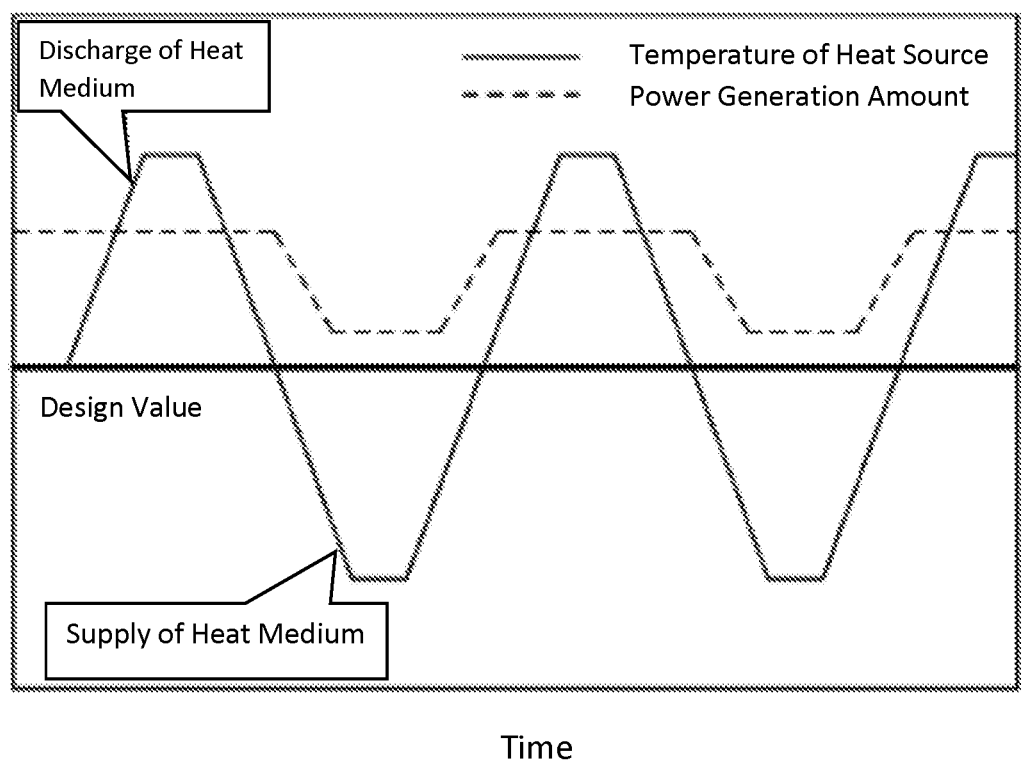
FIG. 16 is a diagram showing changes in the amount of power generation in the present embodiment having a structure of returning the heat medium.

In contrast, the present embodiment includes a structure of returning the heat medium to the first heat medium path 12a, etc. To be more specific, unlike conventional art 2, in the present embodiment, the amount of the heat medium is determined, for example, with an average value of the temperature of the heat medium being set as a design value. Therefore, as shown by a graph of FIG. 16, when the temperature of the heat source increases, the heat medium may be discharged via the relief valve 72. However, after that, if the temperature of the heat source decreases, the temperature of the heat medium which circulates through the first heat medium path 12a, etc., decreases, whereby the pressure of the aforementioned heat medium decreases. For this reason, the heat medium is supplied to the first heat medium path 12a, etc., via the first valve 31 or the check valve 73. Therefore, it is possible to minimize reduction in the amount of power generation in a state where the temperature of the heat source is low. As a result, it is possible to make the time average value of the amount of power generation high as compared to that of conventional art 1 and 2.

Figure 17:
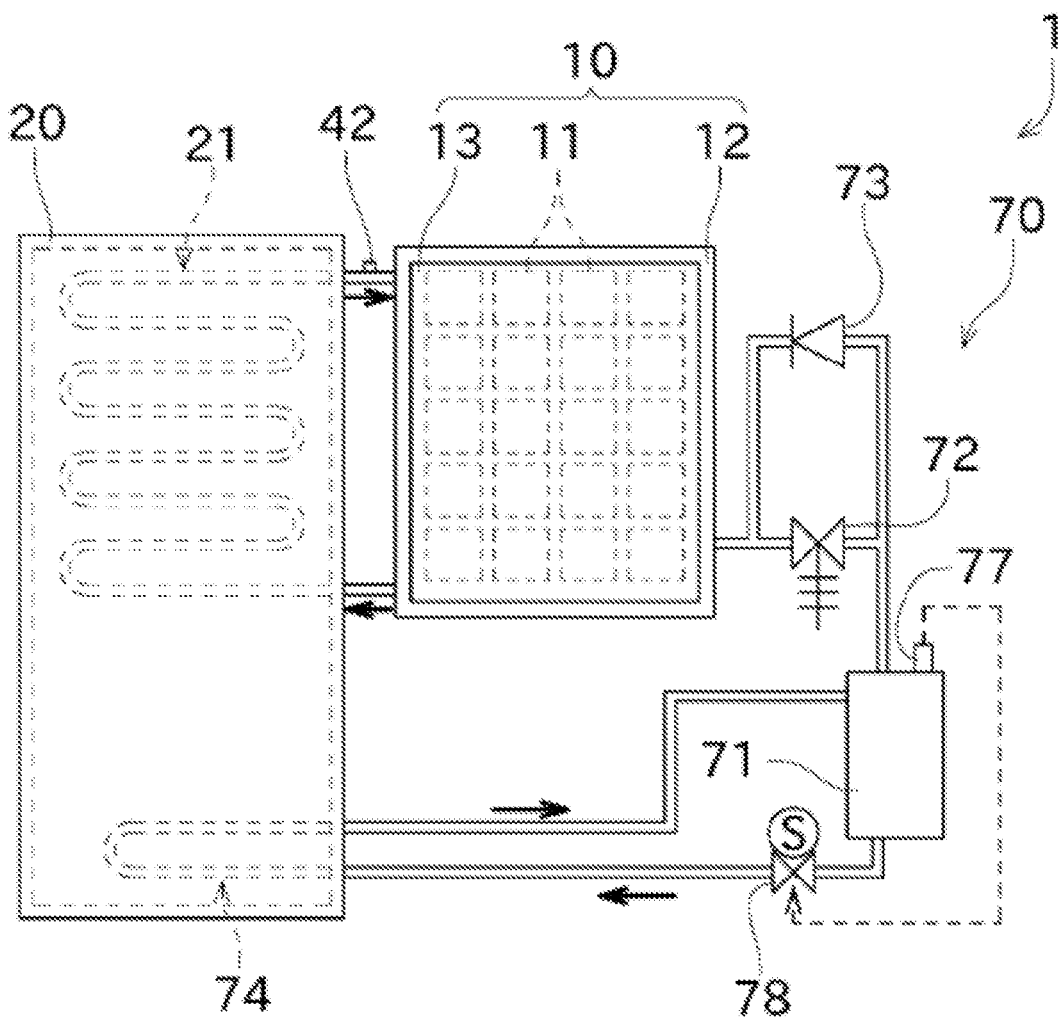
FIG. 17 is a schematic view showing an overall configuration of a thermoelectric generation system according to a third embodiment.

Next, a third embodiment will be described with reference to FIG. 17. FIG. 17 is a schematic view showing an overall configuration of a thermoelectric generation system 1 according to the third embodiment. The third embodiment is different from the second embodiment in the following two points. The first difference is that an auxiliary cooling unit 75 is not provided in the third embodiment. The second difference is that an auxiliary heat transfer unit 74 is provided with an auxiliary heat transfer valve 78.

The pressure holding unit 70 of the second embodiment is configured such that while the heat medium of the pressure holding container 71 is constantly heated by the auxiliary heat transfer unit 74, the heat medium is cooled by the auxiliary cooling unit 75 as necessary. In contrast, a pressure holding unit 70 of the third embodiment is configured to switch, between on and off, the heating by the auxiliary heat transfer unit 74. Specifically, the auxiliary heat transfer valve 78 is configured to be capable of switching between an "open state" in which a heat medium is supplied to a heat source duct 20 and a "closed state" in which the heat medium is not supplied to the heat source duct 20. When the pressure of a pressure holding container 71 is less than a set value, a pressure switch 77 issues an instruction to bring the auxiliary heat transfer valve 78 into the "open state", which causes the heat medium to be heated. Meanwhile, when the pressure of the pressure holding container 71 is greater than the set value, the pressure switch 77 brings the auxiliary heat transfer valve 78 into the "closed state" by not issuing the instruction (stopping the instruction). As a result, the heating of the heat medium in the pressure holding container 71 is stopped, and the heat medium in the pressure holding container 71 is cooled by heat exchange between the outer surface of the pressure holding container 71 and the surroundings, for example. Accordingly, the pressure of the heat medium in the pressure holding container 71 is decreased.

In this way, by adjusting the auxiliary heat transfer valve 78 according to the pressure of the pressure holding container 71, the pressure of the pressure holding container 71 can be constantly approximated to the set value.

In the second and third embodiments, the auxiliary cooling valve 76 and the auxiliary heat transfer valve 78 can both be switched between the "open state" and the "closed state". Instead of the above, the degree of opening (opening area) of the auxiliary cooling valve 76 or the auxiliary heat transfer valve 78 may be changed according to the pressure of the pressure holding container 71, for example. Note that in a case where the degree of opening of the relief valve 72 and the check valve 73 is to be electronically controlled, the degree of opening of the above valves may be changed according to the pressure or the like of the first heat medium path 12a.

As described above, the thermoelectric generation system 1 of the above embodiment includes the thermoelectric element 11, the heating unit 12, the cooling unit 13, the heat transfer unit 21, the pressure gauge 42, the first valve 31, and the control unit 40. The thermoelectric element 11 generates power by a temperature difference. The heating unit 12 includes the first heat medium path 12a through which the heat medium passes, and heats the thermoelectric element 11 by the heat of the heat medium. The cooling unit 13 cools the thermoelectric element 11. The heat transfer unit includes the second heat medium path 21a through which the heat medium passes and which is connected to the first heat medium path 12a, and heats, by using the heat source, the heat medium whose temperature is decreased as a result of heating the thermoelectric element 11. The pressure gauge 42 detects a value (the pressure of the heat medium) that fluctuates according to the temperature of the heat source. The first valve 31 changes the amount of the heat medium which circulates through the first heat medium path 12a and the second heat medium path 21a. The control unit 40 controls the first valve 31 on the basis of the value detected by the pressure gauge 42 to adjust the amount of the heat medium.

The amount of power generation by the thermoelectric element 11 changes according to the temperature and the amount of the heat medium. The amount of power generation can be adjusted by adjusting the amount of the heat medium on the basis of the value detected by the pressure gauge 42.

In addition, in the thermoelectric generation system 1 of the above embodiment, when the value detected by the first valve 31 is a first value, the control unit 40 controls the first valve 31 in such a way that the amount of the heat medium is equivalent to a first amount. When the value detected by the first valve 31 is a second value that is lower than the first value (in other words, when the temperature of the heat source is decreased), the first valve 31 is controlled in such a way that the amount of the heat medium is equivalent to a second amount, which is greater in amount than the first amount (in other words, the amount of the heat medium is increased).

By this feature, when the value detected by the pressure gauge 42 (that is, the temperature of the heat medium) decreases, the amount of the heat medium is increased. Thereby, a significant reduction in the amount of power generation is suppressed. Meanwhile, when the value detected by the pressure gauge 42 increases, the amount of the heat medium is reduced. Thereby, a significant increase in the amount of power generation is suppressed. The amount of power generation can thereby be stabilized.

Also, in the thermoelectric generation system 1 of the above embodiment, the control unit 40 acquires a thermal resistance of the thermoelectric element 11, and adjusts the amount of the heat medium by controlling the first valve 31 on the basis of the thermal resistance.

The amount of power generation by the thermoelectric element 11 changes according to the thermal resistance of the thermoelectric element 11. Accordingly, the amount of power generation can be adjusted by adjusting the amount of the heat medium on the basis of the thermal resistance.

Moreover, in the thermoelectric generation system 1 of the above embodiment, the control unit 40 controls the first valve 31 in such a way that the higher the acquired thermal resistance is, the less the amount of the heat medium becomes.

By this feature, when the thermal resistance turns into low resistance, the amount of the heat medium is increased. Thereby, a significant reduction in the amount of power generation is suppressed. Meanwhile, when the thermal resistance turns into high resistance, the amount of the heat medium is reduced. Thereby, a significant increase in the amount of power generation is suppressed. The amount of power generation can thereby be stabilized.

Further, in the thermoelectric generation system 1 of the above embodiment, in terms of durability of the thermoelectric element 11, the control unit 40 controls the first valve 31 in such a way that the amount of power generation by the thermoelectric element 11 is equivalent to the rated power generation amount.

Consequently, power can be generated at the rated power generation amount.

Furthermore, in the thermoelectric generation system 1 of the above embodiment, the heat transfer unit 21 is provided inside the heat source duct 20, and the thermoelectric element 11 is provided outside the heat source duct 20. Each of the heat transfer unit 21 and the thermoelectric element 11 is attached to the flange member 51 which constitutes a part of the wall portion of the heat source duct 20, which is formed by closing the opening 22 of the heat source duct 20.

By this feature, it is possible to install the thermoelectric generation system 1 on the heat source duct 20 with a simple structure.

Also, the thermoelectric generation system 1 of the above embodiment includes the supporting member 52 which supports the thermoelectric element 11 on the installation surface 61 or the ceiling surface 62 outside the heat source duct 20.

By this feature, since the thermoelectric element 11 is supported on the installation surface 61 or the ceiling surface 62, a load exerted on the heat source duct 20 can be reduced.

Further, the thermoelectric generation system 1 of the second and third embodiments includes the pressure holding container 71, the relief valve 72, the check valve 73, and the auxiliary heat transfer unit 74. The pressure holding container 71 stores the heat medium, and holds the pressure of the heat medium that is being stored at a set value. The relief valve 72 is provided as an adjustment unit, and when the pressure of the heat medium in the first heat medium path 12a satisfies the first pressure condition, the relief valve 72 moves the heat medium to the pressure holding container 71. The check valve 73 is provided as an adjustment unit, and when the pressure of the heat medium in the first heat medium path 12a satisfies the second pressure condition in which the pressure is lower than that of the first pressure condition, the check valve 73 moves the heat medium in the pressure holding container 71 to the first heat medium path 12a. The auxiliary heat transfer unit 74 uses the heat source to heat the heat medium stored in the pressure holding container 71, thereby approximating the pressure of the aforementioned heat medium to the set value.

By this feature, in accordance with the pressure of the heat medium in the first heat medium path 12a, the heat medium can be moved between the first heat medium path 12a and the pressure holding container 71. Consequently, since the amount of the heat medium which circulates through the first heat medium path 12a and the second heat medium path 21a can be maintained at an appropriate value, it is possible to prevent reduction in the amount of power generation. Also, since the auxiliary heat transfer unit 74 is provided, it is possible to prevent the pressure of the heat medium in the pressure holding container 71 from decreasing. In particular, since the heat medium in the pressure holding container 71 is heated by using the heat source, the amount of electricity to be used can be reduced as compared to a configuration in which heating is performed with electric energy.

Furthermore, the thermoelectric generation system 1 of the second and third embodiments is provided with the auxiliary cooling unit 75 which cools the heat medium stored in the pressure holding container 71, thereby approximating the pressure of the heat medium stored in the pressure holding container 71 to the set value.

By this feature, when the pressure of the heat medium in the pressure holding container 71 is high, the aforementioned pressure can be reduced.

Moreover, the thermoelectric generation system 1 of the second and third embodiments is provided with the auxiliary heat transfer valve 78, which changes the amount (the flow rate per unit time) of the heat medium for conducting heat exchange with the heat source in the auxiliary heat transfer unit 74 so as to approximate the pressure of the heat medium stored in the pressure holding container 71 to the set value.

By this feature, the degree of heating of the heat medium by the auxiliary heat transfer unit 74 can be changed. Accordingly, the auxiliary cooling unit 75 can be omitted or the cooling level required for the auxiliary cooling unit 75 can be lowered.

Although preferred embodiments of the present invention have been described, the configurations as described above can be modified as stated below, for example.

The configuration of the power generation module 10 is not limited to the example indicated in the above embodiments. For example, a configuration in which the thermoelectric element 11 is disposed on only one side of the heating unit 12, and the cooling unit 13 is disposed on a surface on the opposite side of the thermoelectric element 11 may be employed.

The flowchart shown in the above embodiment is an example, and addition of processing, omission of processing, or change of processing may be applied. Step S101 may be omitted to omit the processing based on the thermal resistance. Also, step S102 and step S103 may be carried out in parallel.

In the above embodiments, the amount of the heat medium is adjusted so that the amount of power generation conforms to the rated power generation amount. However, a configuration in which the amount of the heat medium is adjusted to conform to the other power generation amount (for example, the amount of power generation required for the thermoelectric generation system 1) may be employed.

In the thermoelectric generation system 1 of the above embodiment, the amount of the heat medium to be circulated is adjusted by adjusting the degree of opening of the first valve 31. Alternatively, the thermoelectric generation system 1 may be configured such that the circulating heat medium is returned to the heat medium tank 30 by using the above-described vacuum pump or another suction device.

The positions for mounting various valves provided in the thermoelectric generation system 1 of the above embodiments are given as an example, and the valves may be mounted at positions different from the positions of the above embodiments.

The thermoelectric generation system 1 may include both the auxiliary cooling valve 76 of the second embodiment and the auxiliary heat transfer valve 78 of the third embodiment. Consequently, it becomes possible to stop the heating of the heat medium by the auxiliary heat transfer unit 74. Thus, even if the flow rate of the cooling medium to be supplied to the pressure holding container 71 is small, the heat medium in the pressure holding container 71 can be sufficiently cooled.

DESCRIPTION OF REFERENCE NUMERALS

1 Thermoelectric generation system
10 Power generation module
11 Thermoelectric element
12 Heating unit
12a First heat medium path
13 Cooling unit
20 Heat source duct
21 Heat transfer unit
21a Second heat medium path
31 First valve (adjustment unit)

32 Second valve (adjustment unit)
40 Control unit
41 Water-level gauge
42 Pressure gauge (detection unit)

The invention claimed is:

1. A thermoelectric generation system comprising:
a thermoelectric element which generates power by a temperature difference;
a heating unit which includes a first heat medium path through which a heat medium passes, and heats the thermoelectric element by heat of the heat medium;
a cooling unit which cools the thermoelectric element;
a heat transfer unit which includes a second heat medium path through which the heat medium passes and which is connected to the first heat medium path, and heats, by using a heat source, the heat medium whose temperature is decreased as a result of heating the thermoelectric element;
a detection unit which detects a temperature of the heat source or a value that fluctuates according to the temperature of the heat source;
an adjustment unit which changes an amount of the heat medium which circulates through the first heat medium path and the second heat medium path; and
a control unit which controls the adjustment unit based on the value detected by the detection unit to adjust the amount of the heat medium,
a pressure holding container which stores the heat medium and holds a pressure of the heat medium that is being stored at a set value;
wherein the adjustment unit includes
a discharge valve which moves the heat medium in the first heat medium path to the pressure holding container only in one direction, and
a return valve which moves the heat medium in the pressure holding container to the first heat medium path only in one direction, and
wherein the discharge valve and the return valve are located in parallel between the pressure holding container and the heating unit.

2. The thermoelectric generation system according to claim 1, wherein the control unit is configured to:
control the adjustment unit in such a way that the amount of the heat medium is equivalent to a first amount, when the value detected by the detection unit is a first value; and
control the adjustment unit in such a way that the amount of the heat medium is equivalent to a second amount, which is greater in amount than the first amount, when the value detected by the detection unit is a second value that is lower than the first value.

3. The thermoelectric generation system according to claim 1, wherein the control unit controls the adjustment unit in such a way that an amount of power generation by the thermoelectric element is equivalent to a rated power generation amount.

4. The thermoelectric generation system according to claim 1, wherein the thermoelectric element and the heating unit are arranged in a thickness direction thereof.

5. The thermoelectric generation system according to claim 1, wherein the detection unit is located in a path directed toward the first heat medium path from the second heat medium path.

6. The thermoelectric generation system according to claim 1, wherein the first heat medium path includes a plurality of paths formed in parallel.

7. The thermoelectric generation system according to claim 1, wherein the first heat medium path is arranged along a vertical direction.

8. The thermoelectric generation system according to claim 1, wherein the thermoelectric element, the heating unit and the cooling units are arranged in a thickness direction thereof.

9. The thermoelectric generation system according to claim 1, wherein:
the heat transfer unit is provided inside a heat source duct, and the thermoelectric element is provided outside the heat source duct; and
each of the heat transfer unit and the thermoelectric element is attached to a flange member which constitutes a part of a wall portion of the heat source duct, which is formed by closing an opening of the heat source duct.

10. The thermoelectric generation system according to claim 9, further comprising a supporting member which supports the thermoelectric element on an installation surface or a ceiling surface outside the heat source duct.

11. The thermoelectric generation system according to claim 1 wherein the thermoelectric element is arranged on the heating unit, and the cooling unit is arranged on the thermoelectric element.

12. The thermoelectric generation system according to claim 11, wherein the thermoelectric element, the heating unit and the cooling units are arranged in a thickness direction thereof.

13. The thermoelectric generation system according to claim 1, wherein the control unit acquires a thermal resistance of the thermoelectric element, and adjusts the amount of the heat medium by controlling the adjustment unit based on the thermal resistance.

14. The thermoelectric generation system according to claim 13, wherein the control unit controls the adjustment unit in such a way that the higher the acquired thermal resistance is, the less the amount of the heat medium becomes.

15. The thermoelectric generation system according to claim 1, further comprising:
an auxiliary heat transfer unit which uses the heat source to heat the heat medium stored in the pressure holding container, thereby approximating the pressure of the heat medium to the set value.

16. The thermoelectric generation system according to claim 15, further comprising an auxiliary cooling unit which cools the heat medium stored in the pressure holding container, thereby approximating the pressure of the heat medium stored in the pressure holding container to the set value.

17. The thermoelectric generation system according to claim 15, further comprising an auxiliary heat transfer valve which changes the amount of the heat medium for conducting heat exchange with the heat source in the auxiliary heat transfer unit so as to approximate the pressure of the heat medium stored in the pressure holding container to the set value.

18. The thermoelectric generation system according to claim 15, wherein the auxiliary heat transfer unit is located in a heat source duct where the heat transfer unit is located.

* * * * *